US009230905B2

(12) United States Patent
Takaki et al.

(10) Patent No.: US 9,230,905 B2
(45) Date of Patent: Jan. 5, 2016

(54) TRENCH MULTILEVEL CONTACT TO A 3D MEMORY ARRAY AND METHOD OF MAKING THEREOF

(71) Applicant: SanDisk 3D LLC, Milpitas, CA (US)

(72) Inventors: Seje Takaki, Yokkaichi (JP); Michiaki Sano, Yokkaichi (JP); Zhen Chen, Yokkaichi (JP)

(73) Assignee: SANDISK 3D LLC, Milpitas, CA (US)

( * ) Notice: Subject to any disclaimer, the term of this patent is extended or adjusted under 35 U.S.C. 154(b) by 100 days.

(21) Appl. No.: 14/150,162

(22) Filed: Jan. 8, 2014

(65) Prior Publication Data

US 2015/0194380 A1   Jul. 9, 2015

(51) Int. Cl.
*H01L 23/50*        (2006.01)
*H01L 27/24*        (2006.01)
*H01L 27/115*       (2006.01)
*H01L 21/768*       (2006.01)
*H01L 27/06*        (2006.01)

(52) U.S. Cl.
CPC .............. *H01L 23/50* (2013.01); *H01L 21/768* (2013.01); *H01L 21/76877* (2013.01); *H01L 27/0688* (2013.01); *H01L 27/115* (2013.01); *H01L 27/1157* (2013.01); *H01L 27/11551* (2013.01); *H01L 27/11556* (2013.01); *H01L 27/11578* (2013.01); *H01L 27/11582* (2013.01); *H01L 27/2481* (2013.01); *H01L 2924/0002* (2013.01)

(58) Field of Classification Search
CPC combination set(s) only.
See application file for complete search history.

(56) References Cited

U.S. PATENT DOCUMENTS

| 5,915,167 A | 6/1999 | Leedy |
| 7,005,350 B2 | 2/2006 | Walker et al. |

(Continued)

FOREIGN PATENT DOCUMENTS

| JP | 2010-050357 A | 3/2010 |
| KR | 20100109745 A | 10/2010 |

(Continued)

OTHER PUBLICATIONS

U.S. Appl. No. 13/443,287, filed Apr. 10, 2012, Johann Alsmeier et al.

(Continued)

*Primary Examiner* — Kyoung Lee
*Assistant Examiner* — Ratisha Mehta
(74) *Attorney, Agent, or Firm* — The Marbury Law Group PLLC

(57) ABSTRACT

A multilevel device includes: at least one device region and at least one contact region having a stack of alternating plurality of continuous electrically conductive layers and plurality of electrically insulating layers located over a base. Each electrically conductive layer in the stack is electrically insulated from the other electrically conductive layers in the stack. The base may include a raised portion and a plurality of recesses in the raised portion, each recess in the plurality of recesses having a different lateral size from the other recesses in the plurality of recesses. The electrically conductive layers in the stack may be substantially conformal to the plurality of recesses in the base and expose one or more top surfaces of the raised portion of the base. A first electrically conductive layer in the stack may be a topmost layer in a laterally central portion of a first one of the plurality of recesses. A second electrically conductive layer in the stack different from the first electrically conductive layer may be a topmost layer in a laterally central portion of a second one of the plurality of recesses.

39 Claims, 17 Drawing Sheets

(56) References Cited

U.S. PATENT DOCUMENTS

| | | |
|---|---|---|
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |
| 7,808,038 B2 | 10/2010 | Mokhlesi et al. |
| 7,846,782 B2 | 12/2010 | Maxwell et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,187,932 B2 | 5/2012 | Nguyen et al. |
| 8,394,716 B2 | 3/2013 | Hwang et al. |
| 8,520,425 B2 | 8/2013 | Xiao et al. |
| 8,787,082 B2 * | 7/2014 | Son .................... H01L 27/0207 365/185.05 |
| 2007/0210338 A1 | 9/2007 | Orlowski |
| 2007/0252201 A1 | 11/2007 | Kito et al. |
| 2009/0230449 A1 | 9/2009 | Sakaguchi et al. |
| 2010/0013049 A1 | 1/2010 | Tanaka |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0254191 A1 | 10/2010 | Son et al. |
| 2010/0320528 A1 | 12/2010 | Jeong et al. |
| 2011/0001182 A1 | 1/2011 | Sato |
| 2011/0031546 A1 | 2/2011 | Uenaka |
| 2011/0076819 A1 | 3/2011 | Kim et al. |
| 2011/0108907 A1 | 5/2011 | Maeda |
| 2011/0133606 A1 | 6/2011 | Yoshida et al. |
| 2011/0169071 A1 | 7/2011 | Uenaka |
| 2011/0266606 A1 | 11/2011 | Park et al. |
| 2011/0284943 A1 | 11/2011 | Hwang et al. |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0147648 A1 | 6/2012 | Scheuerlein |
| 2013/0264631 A1 | 10/2013 | Alsmeier et al. |
| 2013/0270623 A1 | 10/2013 | Suzuki et al. |
| 2013/0313627 A1 * | 11/2013 | Lee .................... H01L 21/76816 257/324 |

FOREIGN PATENT DOCUMENTS

| | | |
|---|---|---|
| KR | 20110021444 A | 3/2011 |
| WO | WO02/15277 A2 | 2/2002 |

OTHER PUBLICATIONS

U.S. Appl. No. 14/136,103, filed Dec. 20, 2013, Sandisk 3D LLC.

Invitation to Pay Additional Search Fees issued in PCT Application No. PCT/US13/41410, mailed Sep. 9, 2013.(6 pp.).

International Search Report & Written Opinion, PCT/US2011/042566, Jan. 17, 2012 (30 pp.).

Invitation to Pay Additional Fees & Partial International Search Report, PCT/US2011/042566, Sep. 28, 2011. (7 pp.).

Endoh, T.et al., titled "Novel Ultra High Density Memory With a Stacked-Surrounding Gate Transistor (S-SGT) Structured Cell", IEDM Proc. (2001) 33-36.

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Kimura, Masahide "3D Cells Make Terabit NAND Flash Possible," Nikkei Electronics Asia, Sep. 17, 2009, 6pgs.

Maeda et al., "Multi-Stacked 1G Cell/Layer Pipe-Shaped BiCS Flash Memory," 2009 Symposium on VLSI Technology Digest of Technical Papers, pp. 22-23.

Tanaka et al., "Bit-Cost Scalable Technology for Low-Cost and Ultrahigh-Density Flash Memory," Toshiba Review, vol. 63, No. 2, 2008, pp. 28-31.

International Search Report ansd Written Opinion received in connection with international application No. PCT/US2014/072678; mailed Mar. 10, 2015.

* cited by examiner

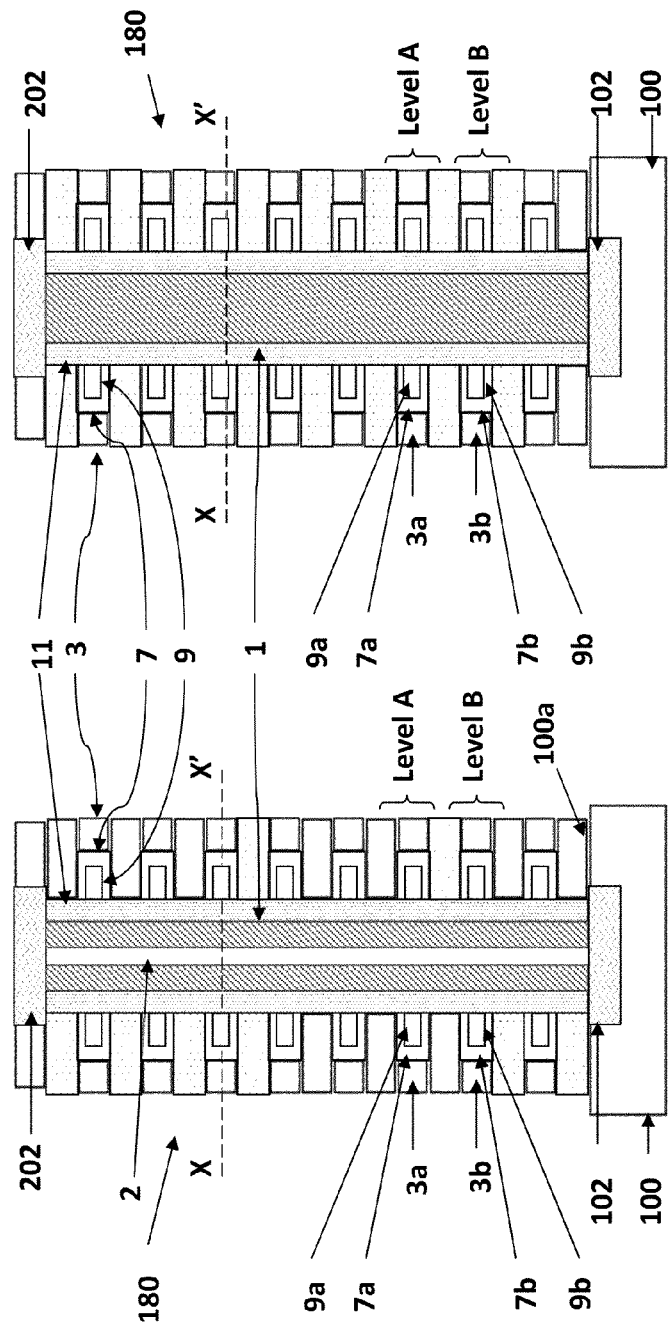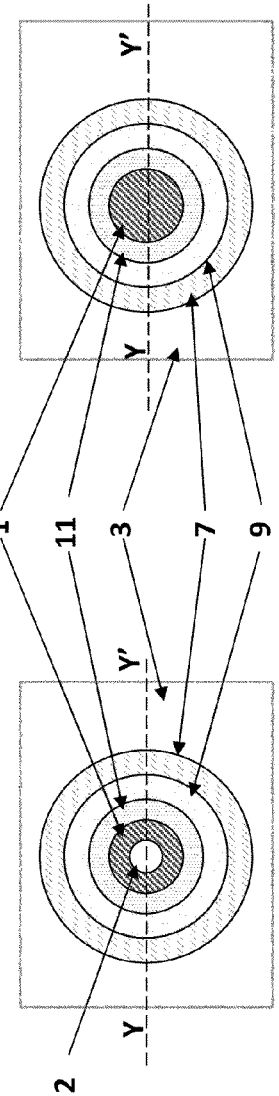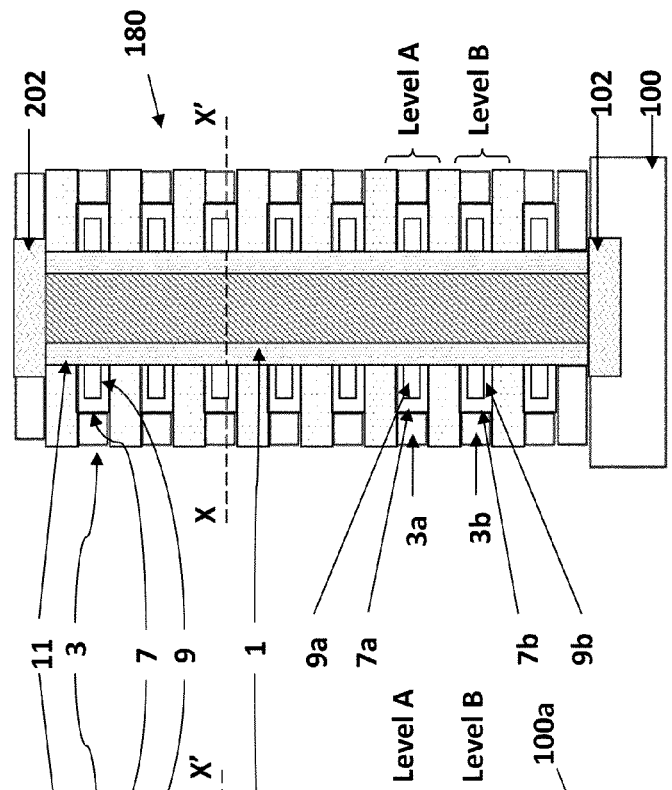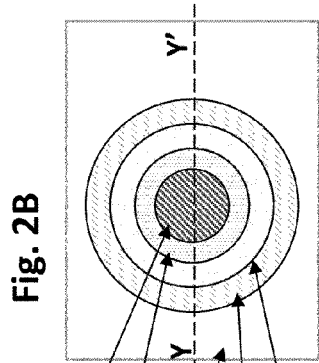

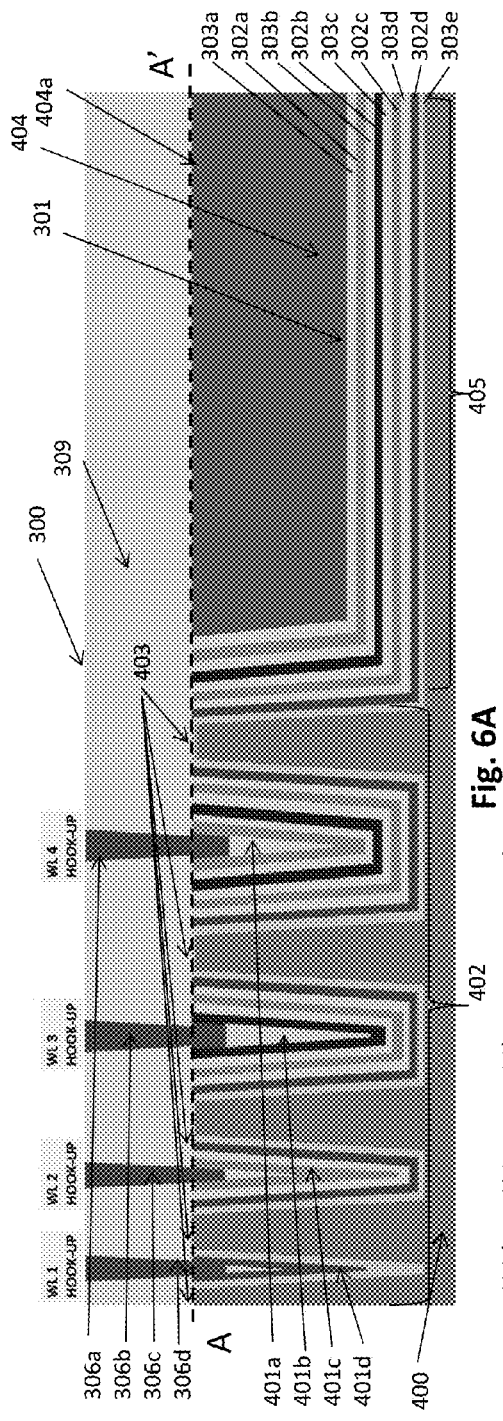
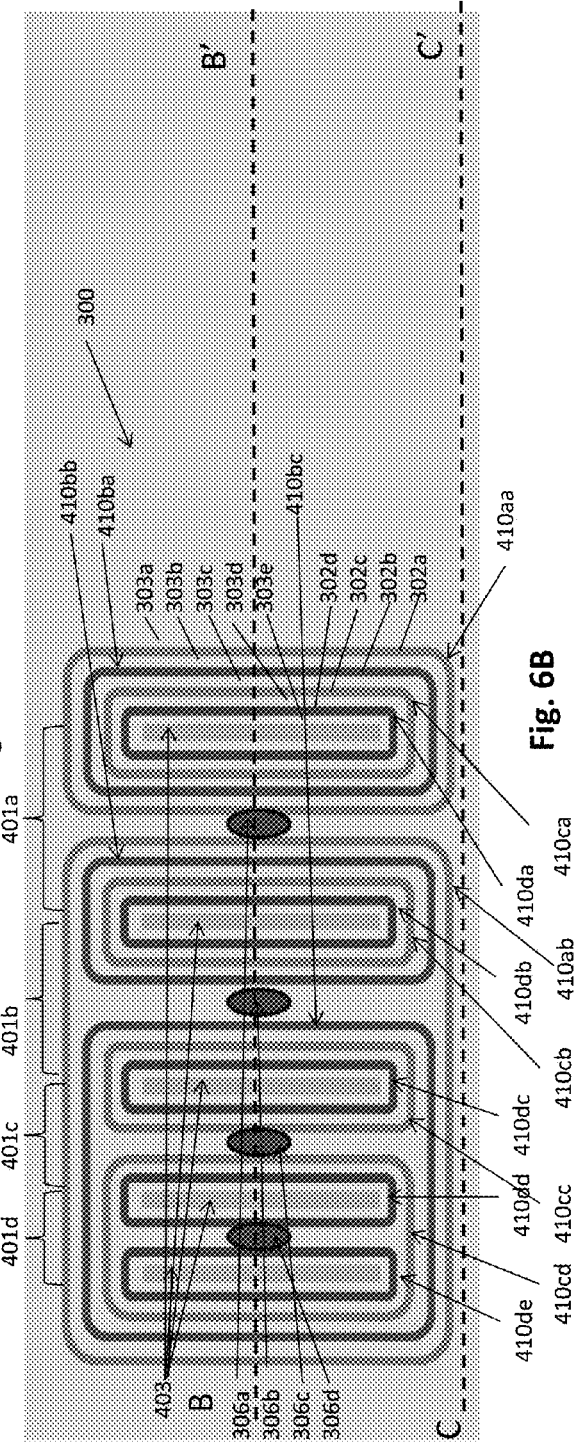
Fig. 6A
Fig. 6B

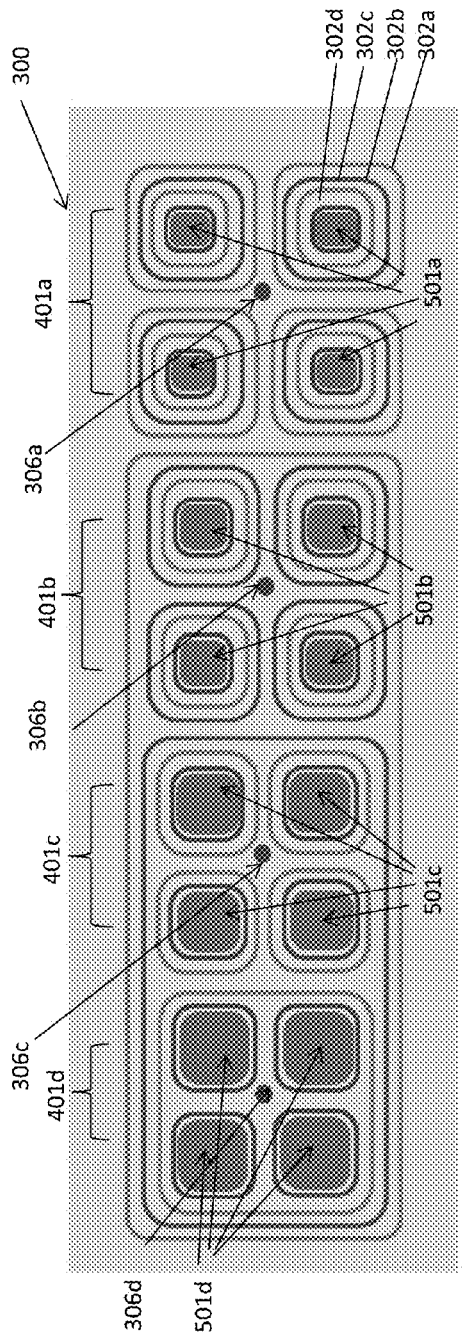
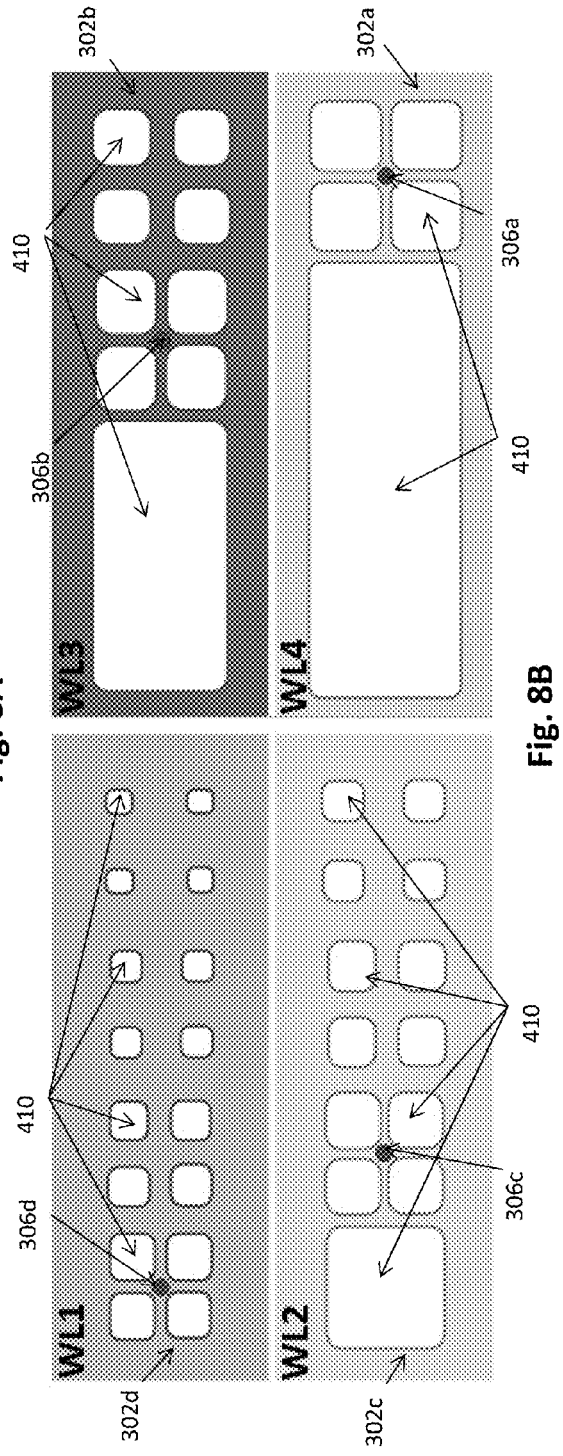
Fig. 8A
Fig. 8B

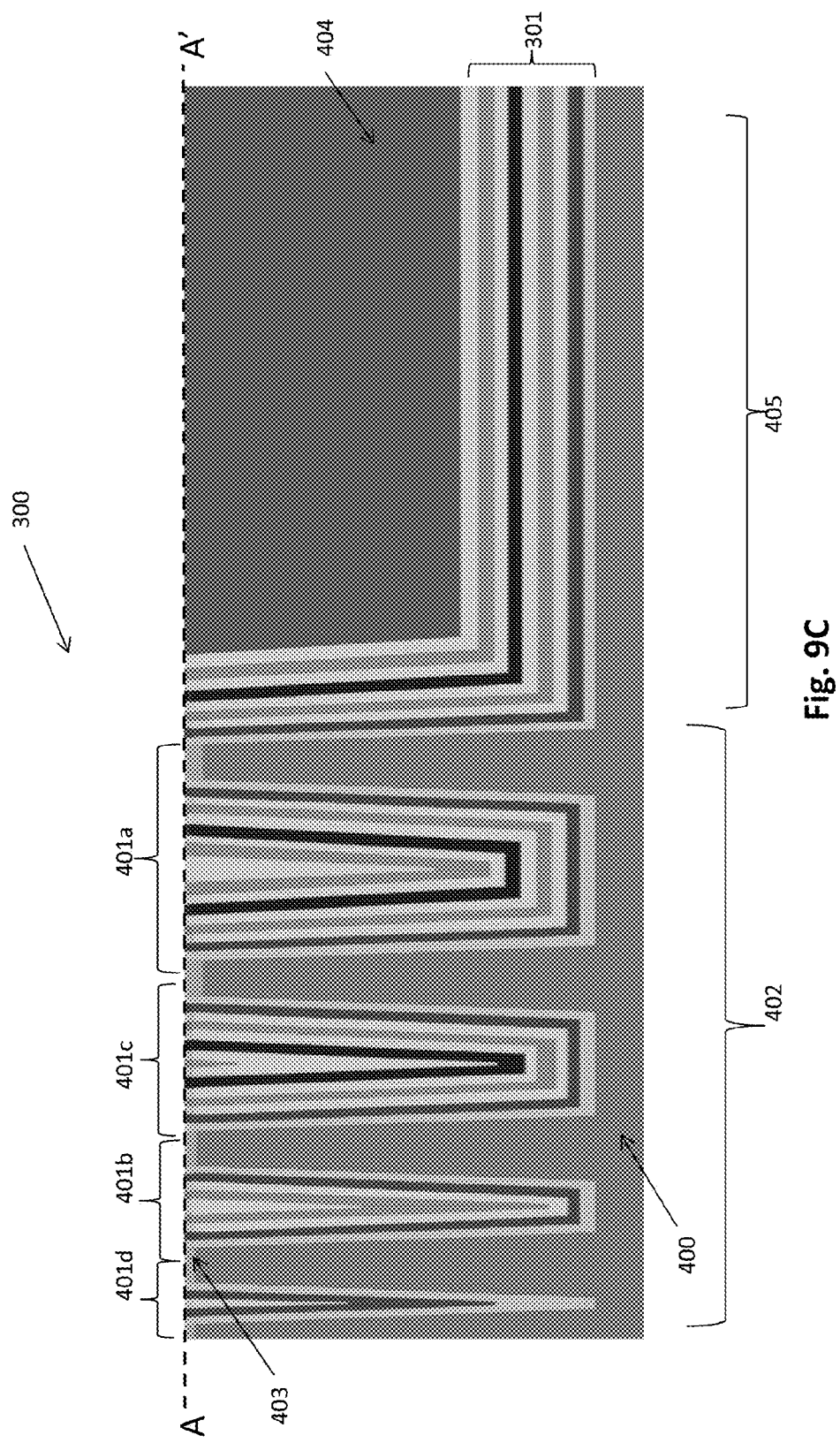

TRENCH MULTILEVEL CONTACT TO A 3D MEMORY ARRAY AND METHOD OF MAKING THEREOF

FIELD

The present invention relates generally to the field of semiconductor devices and specifically to three dimensional vertical NAND strings and other three dimensional devices and methods of making thereof.

BACKGROUND

Three dimensional ("3D") vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process, which results in a roughly conical active region shape.

SUMMARY

One embodiment relates to a multilevel device including: at least one device region and at least one contact region having a stack of alternating plurality of continuous electrically conductive layers and plurality of electrically insulating layers located over a base. In some embodiments, each electrically conductive layer in the stack is electrically insulated from the other electrically conductive layers in the stack. The base may include a raised portion and a plurality of recesses in the raised portion, each recess in the plurality of recesses having a different lateral size from the other recesses in the plurality of recesses. The electrically conductive layers in the stack may be substantially conformal to the plurality of recesses in the base and expose one or more top surfaces of the raised portion of the base. A first electrically conductive layer in the stack may be a topmost layer in a laterally central portion of a first one of the plurality of recesses. A second electrically conductive layer in the stack different from the first electrically conductive layer may be a topmost layer in a laterally central portion of a second one of the plurality of recesses.

Another embodiment relates to a method of making multilevel contacts, including the following steps. Step (a) includes providing an in-process multilevel device comprising at least one device region and at least one contact region. Step (b) includes forming a base in the contact region comprising a raised portion and plurality of recesses in the raised portion, each recess in the plurality of recesses having a different lateral size from the other recesses in the plurality of recesses. Step (c) includes forming a conformal stack of an alternating plurality of continuous electrically conductive layers and plurality of electrically insulating layers located over a base, wherein each electrically conductive layer in the stack is electrically insulated from the other electrically conductive layers in the stack. Step includes (d) removing material from the stack that overlays the raised portion of the base to expose one or more top surfaces of the raised portion of the base, wherein portions of the stack contained in the recesses are not removed.

In various embodiments, the device region may include any suitable multilayer device including, for example, a non-volatile memory device such as a vertical NAND memory device or a vertical restive random access memory (ReRAM) device.

BRIEF DESCRIPTION OF THE DRAWINGS

FIGS. 1A-1B are respectively side cross sectional and top cross sectional views of a NAND string of one embodiment. FIG. 1A is a side cross sectional view of the device along line Y-Y' in FIG. 1B, while FIG. 1B is a side cross sectional view of the device along line X-X' in FIG. 1A.

FIG. 2A-2B are respectively side cross sectional and top cross sectional views of a NAND string of another embodiment. FIG. 2A is a side cross sectional view of the device along line Y-Y' in FIG. 2B, while FIG. 2B is a side cross sectional view of the device along line X-X' in FIG. 2A.

FIGS. 6A-6D illustrate a multilevel contact according to an embodiment. FIG. 6A shows a side view of a vertical cross section of the multilevel contact taken along the line BB' in FIG. 6B. FIG. 6B shows a top view of a horizontal cross section of the multilevel contact taken through the line AA' in FIG. 6A. FIG. 6C shows a side cross sectional view of the multilevel contact taken along the line CC' in FIG. 6B. FIG. 6D shows top views of four electrically conductive layers 302a-302d in the multilevel contact.

FIGS. 8A-8C illustrate a multilevel contact according to another embodiment. FIG. 8A shows a top view the multilevel contact. FIG. 8B shows top views of four electrically conductive layers 302a-302d in the multilevel contact of FIG. 8A. FIG. 8C shows a detailed top view of one recess 401a-401d from FIG. 8A.

FIGS. 9A-9E show a schematic side cross sectional view of steps of a process flow for a method of making a multilevel contact according to the embodiments shown in FIG. 6.

DETAILED DESCRIPTION

Embodiments of the present invention will be described below with reference to the accompanying drawings. It should be understood that the following description is intended to describe exemplary embodiments of the invention, and not to limit the invention.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Embodiments of the invention relate to methods of making contacts to a multilevel memory array, such as a monolithic 3D array. In an embodiment, the multilevel memory device includes at least one device region in which the memory cells (e.g., vertical NAND strings 180 or ReRAM memory cells) are located and at least one contact region in which the multilevel contacts are located. As illustrated in FIGS. 5A and 5B and discussed in more detail below, the distal ends of the electrodes of a ReRAM memory array (e.g., the word lines, WL, of the ReRAM device of FIG. 4) or control gates of a multilevel vertical NAND memory array are arranged in a step-by-step configuration (stepped pattern). In this manner, electrical contact to the individual control gates or electrodes can be achieved by etching an array of openings 130A-130E in the surrounding dielectric layer(s) from the top surface of the memory array down to the steps 120 and depositing contact metal 132 in the openings 130A-130E to contact the steps 120. In conventional methods of fabricating the contacts, the more shallow steps may be heavily over-etched before the deepest steps are exposed.

Other embodiments of the invention provide a monolithic, three dimensional array of memory devices, such as an array of vertical NAND strings or ReRAM devices. The memory cells of such devices may be vertically oriented, such that at least one memory cell is located over another memory cell. The array allows vertical scaling of the devices to provide a higher density of memory cells per unit area of silicon or other semiconductor material.

Figure 4:
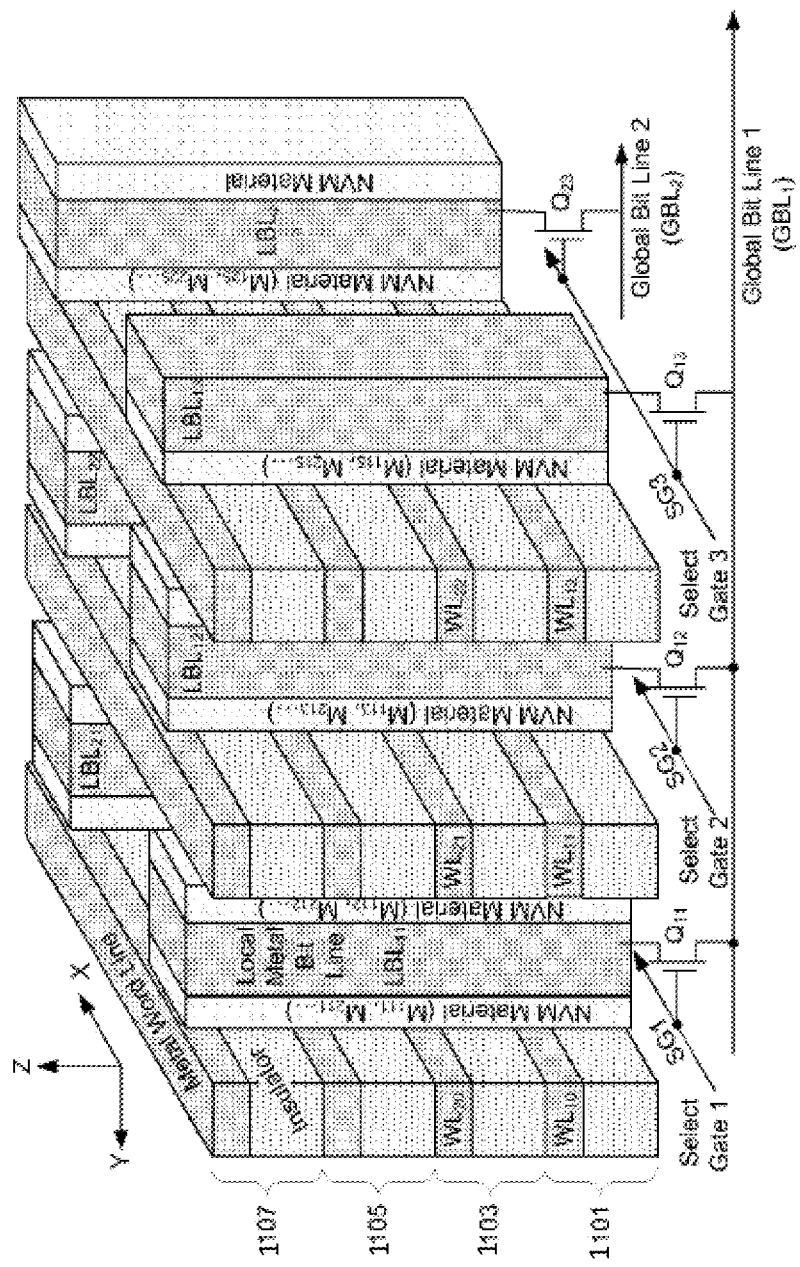
FIG. 4 is a schematic illustration of a vertical bit line ReRAM memory device of another embodiment.
Figure 5A:
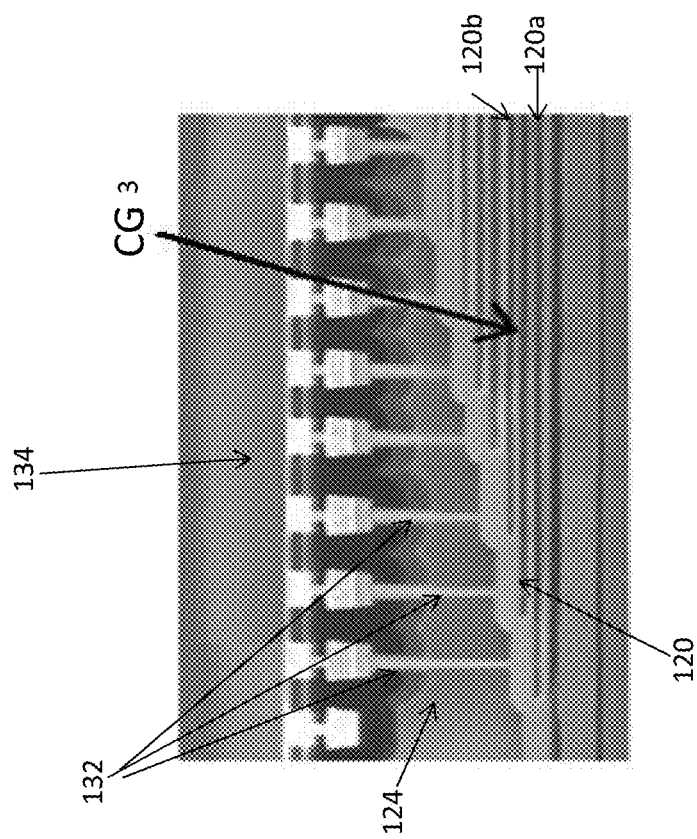
FIG. 5A is a scanning electron microscope (SEM) image of a cross-section of a conventional NAND string memory device showing the contacts to the control gate electrodes (e.g., word lines).
Figure 5B:
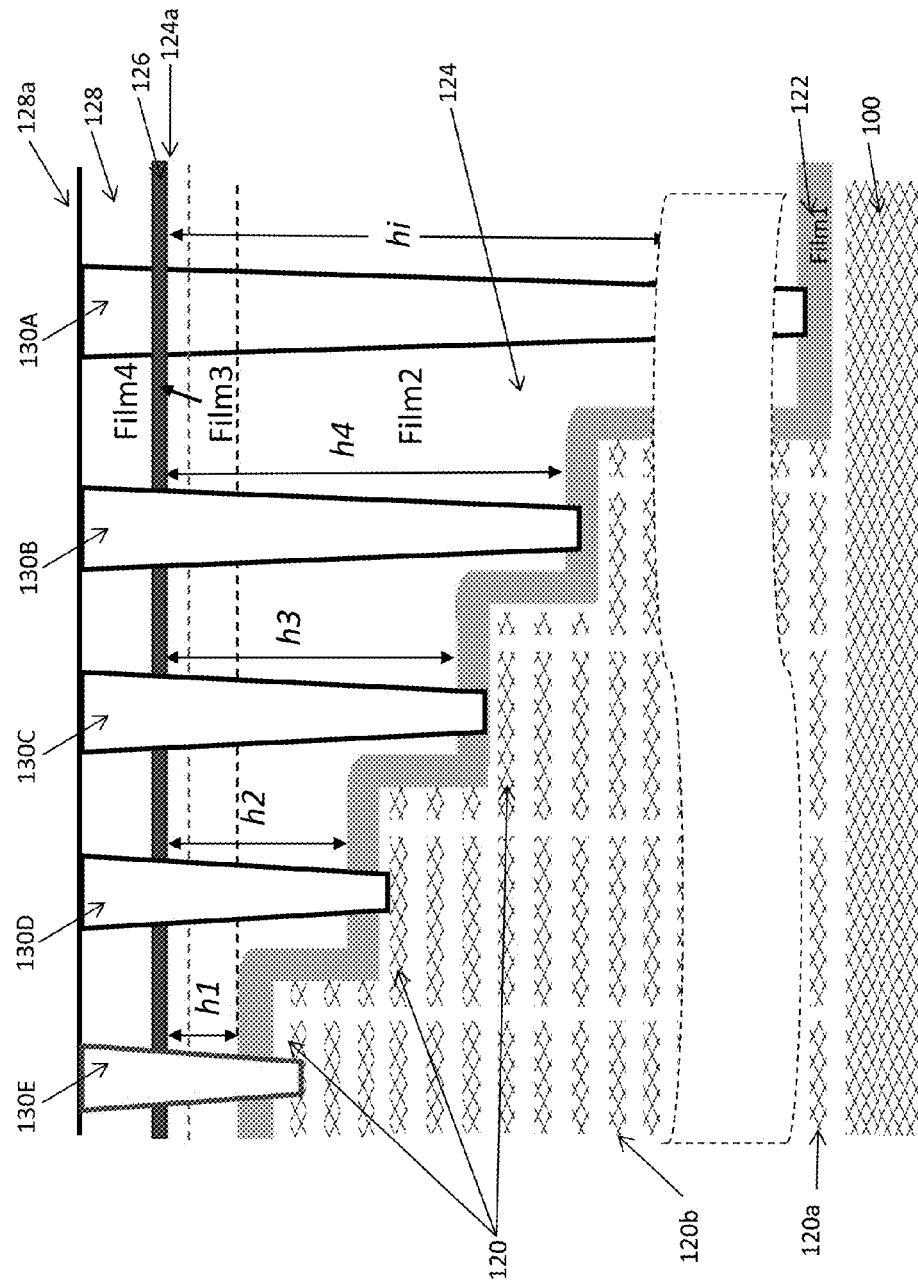
FIG. 5B is a schematic illustration of a conventional method of making a multilevel contact.

Referring to FIG. 4, one example semiconductor structure for implementing a vertically oriented 3D ReRAM memory element array is illustrated, of the type described in U.S. Pat. Pub. No. 2012/0147648, published Jun. 14, 2012. The ReRAM device is configured for use of non-volatile memory element ("NVM") material that is non-conductive when first deposited. Since the material is initially non-conductive, there is no necessity to isolate the memory elements at the cross-points of the word and bit lines from each other. Several memory elements may be implemented by a single continuous layer of material, which in the case of FIG. 4 are strips of NVM material oriented vertically along opposite sides of the vertical bit lines in the y-direction and extending upwards through all the planes. A significant advantage of the structure of FIG. 4 is that all word lines and strips of insulation under them in a group of planes may be defined simultaneously by use of a single mask, thus greatly simplifying the manufacturing process.

Referring to FIG. 4, a small part of four planes 1101, 1103, 1105 and 1107 of the three-dimensional array are shown. All of the planes have the same horizontal pattern of conductor, dielectric and NVM material. In each plane, electrically conductive (e.g., metal) word lines ($WL_{zy}$) are elongated in the x-direction and spaced apart in the y-direction. Each plane includes a layer of insulating material (e.g., a dielectric) that isolates its word lines from the word lines of the plane below it or, in the case of plane 1101, of the substrate circuit components below it. In some embodiments, the word lines $WL_{zy}$ for a fixed value of y form a stack of alternating layers that may extend beyond the memory device into a contact area. For example, in some embodiments, a portion of such a stack of extended word lines and alternating dielectric layers ma form layer stack 301 in the in the contact area 300 as shown in FIGS. 6A-9E (discussed in greater detail below).

Extending through each plane is a collection of electrically conductive (e.g., metal) local bit line (LBL) "pillars" elongated in the vertical z-direction and forming a regular array in the x-y direction.

Each bit line pillar is connected to one of a set of underlying global bit lines (GBL) (e.g., located in the silicon substrate) running in the y-direction at the same pitch as the pillar spacing through the select devices ($Q_{xy}$) formed in the substrate whose gates are driven by the row select lines (SG) elongated in the x-direction, which are also formed in the substrate. The select devices $Q_{xy}$ may be conventional CMOS transistors (or vertical MOSFET thin film transistors, or Junction FET, or npn transistors) and fabricated using the same process as used to form the other conventional circuitry. In the case of using npn transistors instead of MOS transistors, the row select line (SG) lines are replaced with the base contact electrode lines elongated in the x-direction. Also fabricated in the substrate but not shown in FIG. 4 are sense amplifiers, input-output (I/O) circuitry, control circuitry, and any other necessary peripheral circuitry. There is one row select line (SG) for each row of local bit line pillars in the x-direction and one select device (Q) for each individual local bit line (LBL).

Each vertical strip of NVM material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL). In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines.

Figure 3:
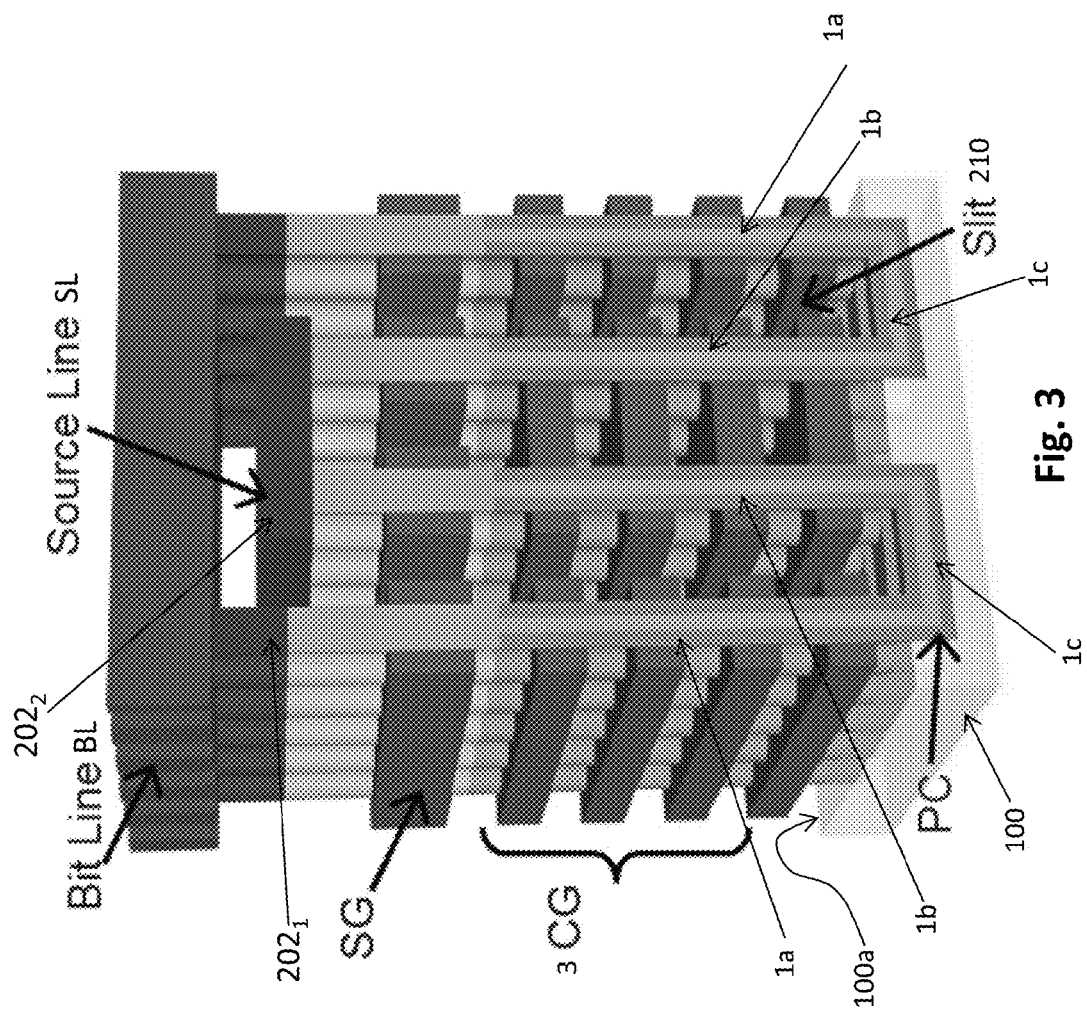
FIG. 3 is a schematic illustration of a NAND string memory device of another embodiment.

Referring back to FIGS. 1A-2B, in some embodiments, the monolithic three dimensional NAND string 180 comprises a semiconductor channel 1 having at least one end portion extending substantially perpendicular to a major surface 100a of a substrate 100, as shown in FIGS. 1A, 2A, and 3. For example, the semiconductor channel 1 may have a pillar shape and the entire pillar-shaped semiconductor channel extends substantially perpendicularly to the major surface 100a of the substrate 100, as shown in FIGS. 1A and 2A. In these embodiments, the source/drain electrodes of the device can include a lower electrode 102 provided below the semiconductor channel 1 and an upper electrode 202 formed over the semiconductor channel 1, as shown in FIGS. 1A and 2A. Alternatively, the semiconductor channel 1 may have a U-shaped pipe shape, as shown in FIG. 3. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain regions $202_1$ contacts the first wing portion of the semiconductor channel from above, and another one of a source or drain regions $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select gate (SG) or access transistors are shown in FIG. 3. In an embodiment as illustrated in FIG. 3, the source regions $202_2$ of adjacent NAND strings may be connect via a source line SL, while the drain regions $202_1$ of adjacent NAND strings may be connect via a bit line BL. In the U-shaped embodiment, a slit 210 separates the two wing portions 1a and 1b of the U-shaped pipe shape. The slit 210 may be filled with a dielectric material.

In some embodiments, the semiconductor channel 1 may be a filled feature, as shown in FIGS. 2A-2B. In some other embodiments, the semiconductor channel 1 may be hollow, for example a hollow cylinder filled with an insulating fill material 2, as shown in FIGS. 1A-1B. In these embodiments, and an insulating fill material 2 may be formed to fill the hollow part surrounded by the semiconductor channel 1.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. materials. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B, and 3. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, copper, aluminum, tantalum, titanium, cobalt, titanium nitride or alloys thereof. For example, in some embodiments, polysilicon is preferred to allow easy processing.

A blocking dielectric 7 is located adjacent to and may be surrounded by the control gate(s) 3. The blocking dielectric 7 may comprise a plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIGS. 1A-1B and 2A-2B. Alternatively, the blocking dielectric 7 may be continuous as shown in FIG. 3.

The monolithic three dimensional NAND string may also comprise a plurality of discrete charge storage segments 9, each of which is located between the blocking dielectric segments 7 and the channel 1. Similarly, the plurality of discrete charge storage segments 9 comprise at least a first discrete charge storage segment 9a located in the device level A and a second discrete charge storage segment 9b located in the device level B. Alternatively, the charge storage segment(s) 9 may be continuous as shown in FIG. 3. That is, the charge storage segments may comprise localized regions in a continuous charge storage layer.

The tunnel dielectric 11 of the monolithic three dimensional NAND string is located between each one of the plurality of the discrete charge storage segments 9 and the semiconductor channel 1. The tunnel dielectric 11 may comprise a plurality of blocking dielectric segments 11 or a continuous layer of dielectric material.

The blocking dielectric 7 and the tunnel dielectric 11 may be independently selected from any one or more same or different electrically insulating materials, such as silicon oxide, silicon nitride, silicon oxynitride, or other high-k insulating materials.

The charge storage segment(s) 9 may comprise a discrete or continuous conductive (e.g., metal or metal alloy such as titanium, platinum, ruthenium, titanium nitride, hafnium nitride, tantalum nitride, zirconium nitride, or a metal silicide such as titanium silicide, nickel silicide, cobalt silicide, or a combination thereof) or semiconductor (e.g., polysilicon) floating gate, conductive nanoparticles, or a discrete or continuous charge storage dielectric (e.g., silicon nitride or another dielectric) feature. For example, in some embodiments, the discrete charge storage segments 9 are discrete charge storage dielectric features, each of which comprises a nitride feature located in the respective clam-shaped blocking dielectric segment 7, where the silicon oxide blocking dielectric segment 7, the nitride feature 9 and the silicon oxide tunnel dielectric 11 form oxide-nitride-oxide discrete charge storage structures of the NAND string. Alternatively, a polysilicon floating gate may be used.

FIG. 5A is a scanning electron microscope (SEM) image that illustrates a cross-section of a vertical NAND memory device. As illustrated in FIG. 5A, the contacts 132 extend from a top surface of a contact region 134 to the gate electrode steps 120 (e.g., a stepped word line pattern) of the control gates 3. As discussed in more detail below, the contacts 132 are made by filling vias formed in an electrically insulating (dielectric) material 124 with an electrically conducting material, such as tungsten, TiN, copper or aluminum or their alloys or silicides. To form the stepped pattern illustrated in FIG. 5A, the control gate electrodes 3 are configured such that a first conductive layer (e.g., a lower layer in the stack of layers) includes a portion that laterally extends past a second conductive layer (e.g., a higher layer in the stack). The contact openings include a first contact opening (e.g., 130A, in FIG. 5B) that extends to the first portion of the first conductive layer (e.g., 120a) and a second contact opening (e.g., 130B in FIG. 5B) extends to an upper surface of the second conductive layer (e.g., 120b). For example, the first conductive layer (e.g., 120a) may be a portion of a first control gate electrode 3 which extends from the device region to the contact region 134 and the second conductive layer (e.g., 120b) may be a portion of a second control gate electrode 3 which extends from the device region to the contact region 134.

FIG. 5B illustrates the problem of shallow side over etching with the conventional method of making the multilevel contact of FIG. 5A discussed above. In the conventional method, the control gate steps 120 are covered with a stack of layers of dielectric (electrically insulating) materials. The first dielectric layer is a conformal etch stop layer 122. The conformal etch stop layer 122 may be made of any suitable material, such as silicon nitride. The conformal etch stop layer 122 is covered with a second dielectric layer 124, made of a different material than layer 122. The second dielectric material may be made of any suitable material including oxides, such as silicon oxide (e.g., $SiO_2$). The second dielectric layer 124 is not conformal. That is, the thickness (h1, h2, h3, h4 . . . hi) of the dielectric layer 124 varies over each step 120 such the upper surface 124a of the second dielectric layer 124 is the same distance from the substrate 100 over all of the steps 120. A third dielectric layer, sacrificial barrier layer 126, is deposited over the second dielectric layer 124. The sacrificial barrier layer 126 may be made of any suitable material, such as silicon nitride (e.g., preferably the same material as conformal etch stop layer 122 but a different from material the second dielectric layer 124). A fourth dielectric layer 128 is then deposited over the sacrificial barrier layer 126. The fourth dielectric layer 128 may be made of any suitable material including oxides, such as silicon oxide, (e.g., $SiO_2$).

To make the contacts to the control gate steps 120, openings 130A-130E are etched from the top surface 128a of the fourth dielectric layer 128 through the fourth dielectric layer 128, the sacrificial barrier layer 126 and the second dielectric layer 124. Typically, the fourth dielectric layer 128 and the sacrificial barrier layer 126 are non-selectively etched (i.e., etched with an etchant that etches all materials at essentially the same rate) in a first etching step. Then the second dielectric layer 124 is selectively etched (i.e., etched with an etchant that etches one material (e.g. the second dielectric material 124) substantially faster (e.g., 2-10× or more faster) than the underlying material (e.g., etch stop layer 122)) so that the openings stop on the etch stop layer 122.

However, when etching the openings 130A-130E, it is not uncommon that the shallower openings (e.g., 130E, 130D, 130C) will penetrate the etch stop layer 122 prior to the longer openings (e.g. 130A) reaching the etch stop layer 122. This especially problematic as the number of levels (steps) increases. The number of levels in a multilevel memory device, such as a multilevel NAND device, is unlimited and may include, for example, 2-256 levels, such as 4-128 levels such as, 8-64 levels, such as 16-32 levels. The contacts are completed by depositing an electrically conducting material, such as Cu, Al, their alloys or a silicide (e.g., Ti, Ni or Co silicide) into the openings 130A-130E.

FIGS. 6A-6D illustrate a first embodiment of a multilevel contact in a device. In some embodiments, the multilevel contact advantageously avoids some or all of the difficulties described above with respect to conventional contact techniques.

The device includes at least one device (e.g., active) region (not shown in FIG. 6A) (e.g., such as the NAND or ReRAM active region shown in FIGS. 2A-4) and at least one contact region 300. The contact region 300 has a stack 301 of an alternating plurality of electrically conductive layers 302a, 302b, 302c and 302d and plurality of electrically insulating layers 303a, 303b, 303c, 303d, and 303e located over a base 400 (e.g., substrate 100 described above or an insulating layer). Although a stack 301 having four conductive layers 302a-302d is shown, in other embodiments any suitable number of conductive layers may be used, e.g., 2, 3, 4, 5, 6, 7, 8, or more layers. Some embodiments may include 2-256 layers, such as 4-128 layers, such as, 8-64 layers, such as 16-32 layers.

In some embodiments, the conductive layers 302a, 302b, 302c and 302d extend past the left or right side of the illustration, to provide electrical connections to respective levels in a multilevel device in the device region (e.g., underlaying insulating layer 309 outside of the contact region 300). For example, in some embodiments the conductive layers 302a-302d may comprise or be in electrical contact with word lines (e.g., control gates) of a NAND device or the electrodes (e.g., word lines) of a ReRAM device.

Each electrically conductive layer 302a-302d in the stack 301 is electrically insulated from the other electrically conductive layers 302a-302d in the stack 301. The base 400 includes a raised portion 402 and a plurality of recesses 401a-401d in the raised portion, each recess 401a-401d having a different lateral size from the other recesses 401a-401d. For example, as shown in FIGS. 6A and 6B, rightmost recess 401a is narrower than next rightmost recess 401b which is narrower than second rightmost recess 401c which is narrower than the fourth rightmost recess 401d. Although four recesses 401a-401d are shown, any suitable number of recesses may be used e.g., 2, 3, 4, 5, 6, 7, 8, or more recesses. Some embodiments may include 2-256 recesses, such as 4-128 recesses, such as, 8-64 recesses, such as 16-32 recesses. In some embodiments, the number of recesses 401 may be equal to the number of electrically conductive layers 302.

In some embodiments, the electrically conductive layers 302a-302d in the stack 301 are substantially conformal to the plurality of recesses 401a-401d in the base 400 and expose one or more top surfaces 403 of the raised portion of the base 400. In some embodiments, the top surfaces 403 of the raised portion of the base 400 may include a hard mask material used during fabrication as discussed in detail below.

As shown, a first electrically conductive layer 302a in the stack 301 is a topmost layer in a laterally central portion of a first one 401a of the plurality of recesses 401a-401d and a second electrically conductive layer 302b in the stack different from the first electrically conductive layer 302a is a topmost layer in a laterally central portion of a second one 401b of the plurality of recesses 401a-401d. For example, as shown in FIGS. 6A and 6B, electrically conductive layer 302a is the topmost layer in a laterally central portion of recess 401a. Electrically conductive layer 302b is the topmost layer in a laterally central portion of recess 401b. Electrically conductive layer 302c is the topmost layer in a laterally central portion of recess 401c. Electrically conductive layer 302d is the topmost layer in a laterally central portion of recess 401d. In various embodiments, each electrically conductive layer 302 in the stack 301 may be the topmost layer in a laterally central portion of a respective recess 401.

Figure 6C:
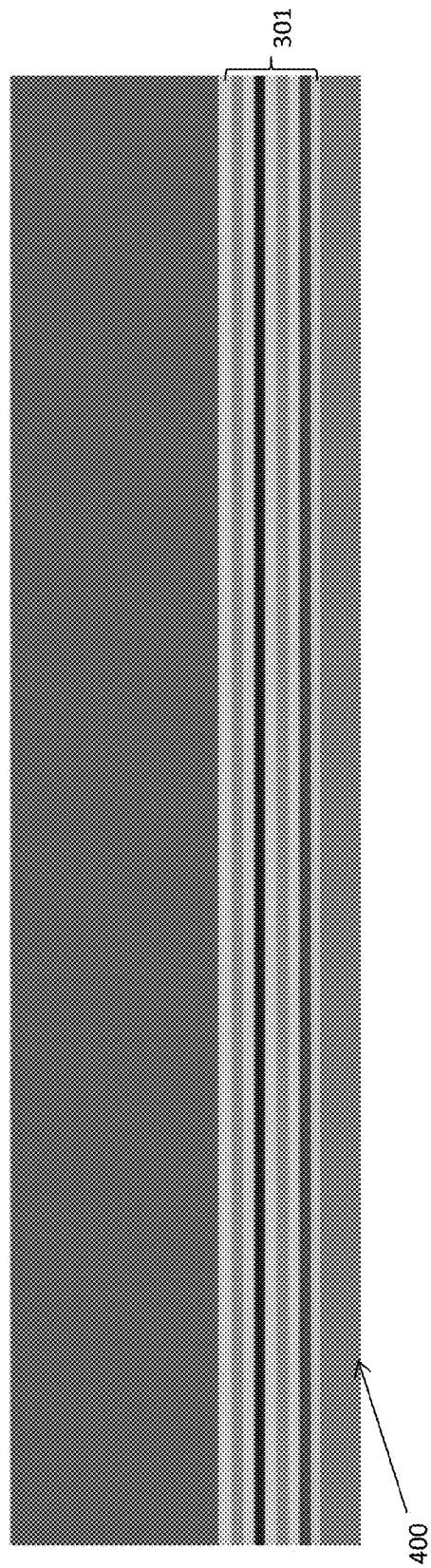

In some embodiments, the base layer 400 includes a substantially flat unraised portion 405. For example, in some embodiments the raised portion 402 may be a raised mesa surrounded by an unraised portion 405. For example, FIG. 6C shows a cross sectional view taken along the line C-C' away from the raised portion 402. In this view, the stack 301 is flat and not deformed by the raised portion 402. In some embodiments, other configurations may be used. For example, the raised portion 402 may be a raised step adjacent to an unraised portion 405.

Figure 6D:
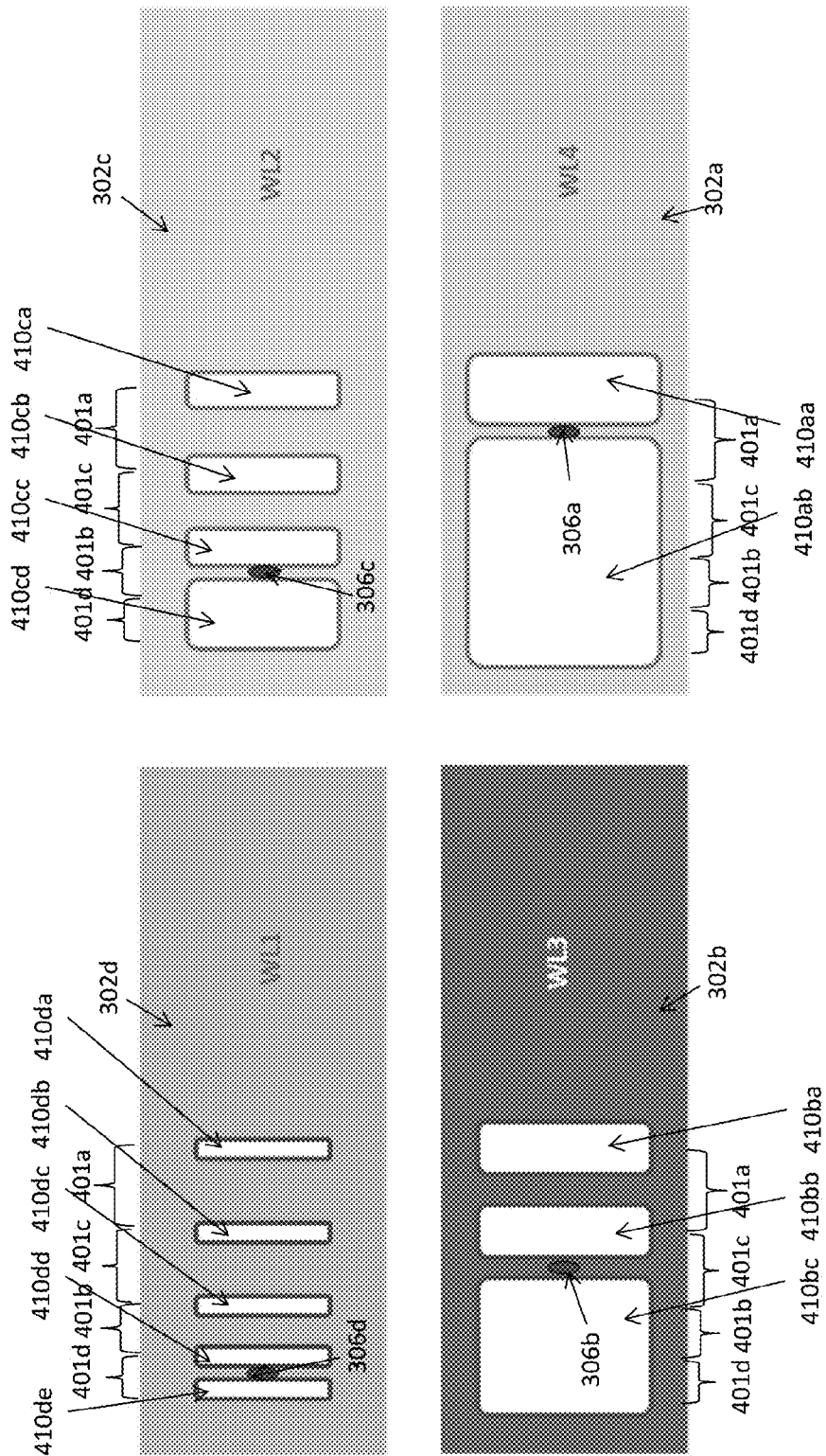

The recesses 401a-401d may take any suitable shape. For example, as shown in FIGS. 6A, 6B, and 6D, the recesses 401a-401d comprise trenches. The trenches may include a recessed portion surrounded on all lateral sides by sidewalls. The trenches, as viewed from above, may have any suitable shape, such as circular, oval, or rectangular. In some embodiments, e.g., as shown in FIGS. 6A, 6B, and 6D, the trenches may elongated along one lateral dimension and narrow along a transverse (e.g., perpendicular lateral) dimension. The lateral sidewalls of the trenches may be angled (as shown) or vertically straight.

However, in other embodiments the recesses 401a-401d may take other forms. For example, as described in greater detail below with reference to FIGS. 8A-8C the recesses 401a-401d may each be formed as a canyon defined by a respective plurality of pillars 501a-501d.

As shown, the first recess 401a is sized to include portions of each one of the electrically conductive layers 302a-302d in the stack 301. This ensures that the top conductive layer 302a in the stack 301 is the topmost layer in a laterally central portion of recess 401a. The remaining recesses 401b-401d each contain a portion of fewer than all of the electrically conductive layers 302a-302d in the stack 301. Recess 401b contains portions of three electrically conductive layers 302b-302d (e.g., the bottom three conductive layers but not the top conductive layer), such that the layer 302b is the topmost layer in a laterally central portion of recess 401b. Recess 401c contains portions of two bottom electrically conductive layers 302c and 302d, such that the layer 302c is the topmost layer in a laterally central portion of recess 401c. Recess 401d contains portions of one electrically conductive layer 302d, such that the layer 302d is the topmost layer in a laterally central portion of recess 401d.

In this configuration, each recess 401 includes a different conductive layer 302 as the topmost layer in a laterally central portion of recess (e.g., at least at a half way point between opposing recess sidewalls). Thus, each recess 401 presents a target for a via connection 306 to a respective electrically conductive layer 302.

As shown in FIG. 6A, an overlayer 309 overlays the stack 301 and the base 400. The overlayer 309 is in contact with one or more top surfaces 403 of the raised portion 402 of the base 400. Optionally, as shown, a fill layer 404 (e.g., an insulating layer) may be included over the portion of the stack 301 over the unraised portion 405 of the base 400. The top surface 404A of the fill layer 404 is preferably planar with top surfaces 403 of the raised portion 402 of the base 400, such that the overlayer 309 is formed over a substantially planar surface 403/404A throughout the contact region 300. The fill layer may 404 be made from, any suitable insulating material including, for example, an oxide (e.g., silicon oxide, $Al_2O_3$, $HfO_2$, etc.) or nitride (e.g., silicon nitride).

A first via connection (e.g., via connection 306a) extends vertically through the overlayer 309 and contacts the first electrically conductive layer (e.g., layer 302a) at the laterally central portion of the first recess (e.g. 401a). A second via connection (e.g., via connection 306b) extends vertically through the overlayer and contacts the second electrically conductive layer (e.g., layer 302b) at the laterally central portion of the second recess (e.g., 401b). The first via connection 306a is in electrical contact with the first electrically conductive layer 302a, and electrically insulated from all other electrically conductive layers 302b-302d in the stack 301. The second via connection 306b is in electrical contact with the second electrically conductive layer 302b, and is electrically insulated from all other electrically conductive layers 302a, 302c, 302d in the stack 301. Similarly, additional via connections may be made. As shown, via connections 306c and 306d each provide electrical connection to only electrically conductive layers 302c and 302d, respectively.

FIG. 6D shows top views of each electrically conductive layer 302a-302d (e.g., word lines WL4, WL3, WL2, and WL1, respectively) in the region of the trenches 401a-401d. Note that each electrically conductive layer 302a-302d contacts exactly one respective via connection 306a-306d, while including gaps 410aa-410de (shown as white space) that avoid contact with the other ones of the via connections 306a-306d. For example, the electrically conductive layer 302a contacts only via connection 306a, while including gaps 410aa, 410ab that via connections 306b-306d may pass through. The electrically conductive layer 302b contacts only via connection 306b, while including gaps 410ba, 410bb, 410bc that via connections 306a, 306c, 306d may pass through. The electrically conductive layer 302c contacts only via connection 306c, while including gaps 410ca, 410cb, 410cc, 410cd that via connections 306a, 306b, 306d may pass through. The electrically conductive layer 302d contacts only via connection 306c, while including gaps 410da, 410db, 410dc, 410dd, and 410de that via connections 306a, 306b, 306c may pass through. Note that although each of electrically conductive layers 302a-30d included gaps, the layers remain continuous, such that each point in a given layer is in electrical contact with every other point in the layer.

As shown in FIG. 6D, the gaps 410aa-410de in the electrically conductive layers may be arranged in a nested fashion. In topmost electrically conductive layer 302a in stack 301, the leftmost gap 410ab is relatively larger, while the rightmost gap 410aa is relatively smaller (e.g., narrower along the x-direction). The leftmost gap 410ab completely surrounds recesses 401b-401d, and allows corresponding via connections 306b-306d to pass through the layer 302a to contact underlying conductive layers 302b-302d. The via connection 306a contacts the conductive layer 302a at a portion located between the larger gap 410ab and the smaller gap 410aa.

In the second topmost electrically conductive layer 302b in stack 301, the leftmost gap 410bc is relatively larger, while the remaining gaps 410bb and 410ba are relatively smaller (e.g., narrower along the x-direction). The leftmost gap 410bc completely surrounds recesses 401d-401c, and allows corresponding via connections 306c-306d to pass through the layer 302b to contact underlying conductive layers 302c and 302d. The via connection 306b contacts the conductive layer 302b at a portion located between the larger gap 410bc and the adjacent smaller gap 410bb.

In the third topmost electrically conductive layer 302c in stack 301, the leftmost gap 410cd is relatively larger, while the remaining gaps 410ca-410cc are relatively smaller (e.g., narrower along the x-direction). The leftmost gap 410cd completely surrounds recess 401d, and allows corresponding via connection 306d to pass through the layer 302c to contact underlying conductive layer 302d. The via connection 306c contacts the conductive layer 302c at a portion located between the larger gap 410cd and the adjacent smaller gap 410cc.

In the bottom electrically conductive layer 302d in stack 301, the leftmost gap 410de is the same size as the remaining gaps 410da-410dd (e.g., all gaps 401da-410de are elongated slits that are narrower along the x-direction). The via connection 306d contacts the conductive layer 302d at a portion located between the leftmost gap 410de and the adjacent smaller gap 410dd. The spacing between the gaps on the right is smaller than the spacing between the gaps on the left in layers 302b-302d. For example, in layers 302b and 302c, the smaller gaps are spaced apart from each other by a greater distance than the larger gaps.

As will be understood by one skilled in the art in view of the present disclosure, the nested arrangement described above can be readily extended to allow for hook up of any arbitrary number of electrically conductive layers 302 and via connections 306.

In some embodiments, the exposed portion of the topmost layer 302 in each recess 401 may provide a relatively wide "target" for the respective via connection 306. For example, as shown, in each recess 401a-40c, the respective topmost electrically conductive layer 302a-302d extends laterally beyond the respective via connection 306a-306d at the location of contact between the via connection 306 and the conductive layer 302.

Figure 7B:
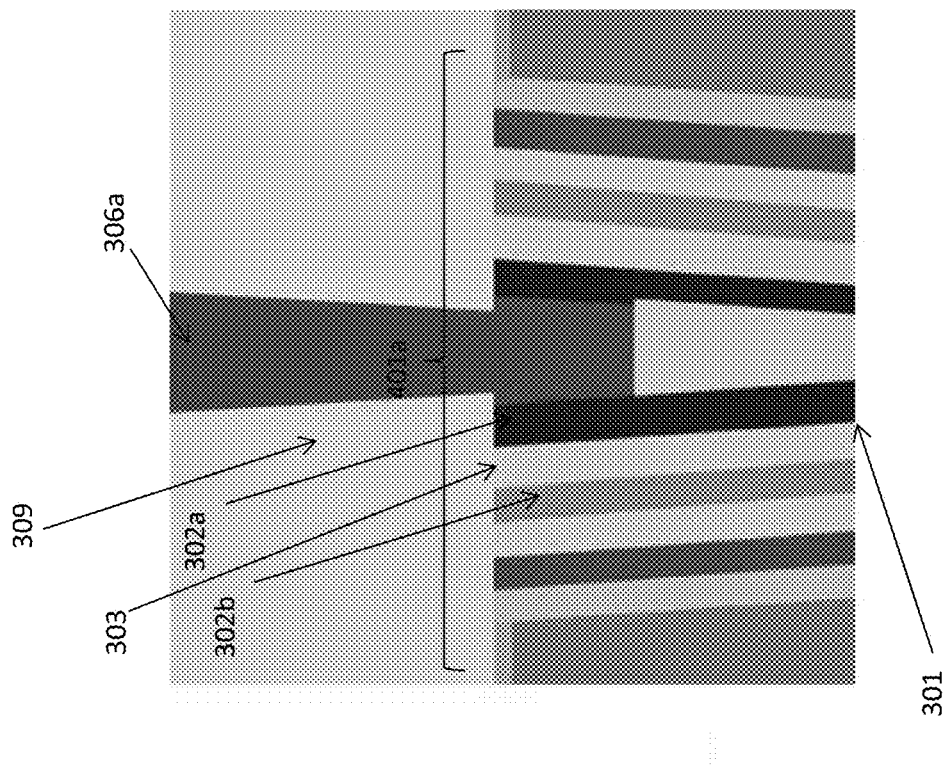
FIGS. 7A and 7B show a detailed views of one of recess 401a of FIG. 6A before and after overlayer and via connection formation, respectively.
Figure 7A:
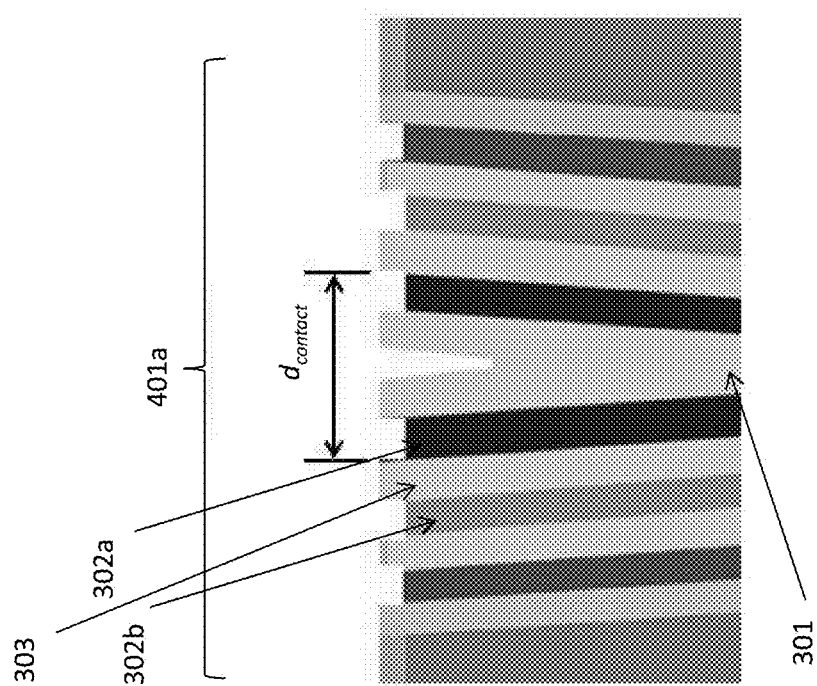

In some embodiments, the tops of the plurality of electrically conductive layers 302a-302d and insulting layers 303a-303 in the stack are removed in each of the plurality of recesses 401a-401d to expose sidewalls of a respective one of the electrically conductive layers 302a-302d. For example, as shown in FIGS. 6A, 7A, and 7B, the exposed sidewalls in each recess 401a-401d are the inside faces of the angled or "v-shaped" walls of the respective topmost exposed electrically conductive layer 302a-302d. In some embodiments, e.g., as shown, a respective one of the first via connections 306a-306d contacts these exposed sidewalls of respective electrically conductive layers 302a-302d in a respective one of recesses 401a-401d.

As shown in detail in FIGS. 7A and 7B, the above described trench configuration may be advantageous, as it may prevent loss of contact even in cases where the via connections 306a-306d are misaligned with their corresponding recesses 401a-401d (e.g., due to errors during fabrication). That is, in some embodiments, the relatively wide exposed portion of the topmost layer 302 in each recess 401 is a relatively large lateral target for the via connection 306. For example, as shown in FIG. 7A, the maximum lateral dimension of the via contact $d_{contact}$ that may be used to contact the topmost layer 302a in the trench 401a without accidentally contacting the underlying layer 302b is equal to the sum of four times the thickness of the electrically conductive layer 302a and twice times the thickness of the insulating layers 303 divided by the sine of the sidewall angle for the trench 401a (i.e., a vertical trench sidewall would have a sidewall angle of 90 degrees).

Similarly, because the exposed sidewalls of each topmost layer 302a-302d in the trenches 401a-401d may be vertically longer than the vertical thickness of the electrically conductive layers 302a-302d outside of the trenches, the risk of via over penetration through the topmost layer 302a-302d in each trench 401a-401d to an underlying conductive layer is reduced.

As noted above, although stack 301 includes four conductive layers 302a-302d, in other embodiments, any suitable number may be used. In some embodiments, the stack 301 comprises N electrically conductive layers $l_n$ where n is any integer where $1 \leq n \leq N$, and N is a positive integer greater than 2, such as greater than three, such as greater than 4. In some embodiments, N is in the range of 2-256, such as 4-128, such as, 8-64, such as 16-32. In some embodiments, the base comprises N recesses $r_n$. In some embodiments, a recess $r_n$ contains a portion of the first n bottommost electrically conductive layers in the stack. In some embodiments, a layer $l_n$ is the topmost electrically conductive layer in a laterally central portion of recess $r_n$. For example, N=4 in FIGS. 6A-6D, $l_1$ corresponds to layer 302a, $l_3$ corresponds to layer 302b, $l_2$ corresponds to layer 302c, $l_1$ corresponds to layer 302d, $r_4$ corresponds to recess 401a, $r_3$ corresponds to recess 401b, $r_2$ corresponds to recess 302c, and $r_1$ corresponds to recess 302d. Some embodiments may include N via connections $v_n$ each of which extends vertically through the overlayer 309 to contact a respective electrically conductive layer $l_n$ in the laterally central portion of respective recess $r_n$.

The conductive layers 302a-302d may be made from any suitable conductive material including a metal, a metal alloy, a metal silicide, or a highly doped semiconductor (e.g., W, $WSi_x$, WN, Ti, TiN, doped polysilicon, etc.). The insulating layers 303a-303e may be made from any suitable insulating material including, for example, an oxide (e.g., silicon oxide, $Al_2O_3$, $HfO_2$, etc.). Although four alternating electrically conductive layers 302a-302d with five insulating layers 303a-303e are shown in stack 301, as noted above, any other suitable number may be used.

Figure 8C:
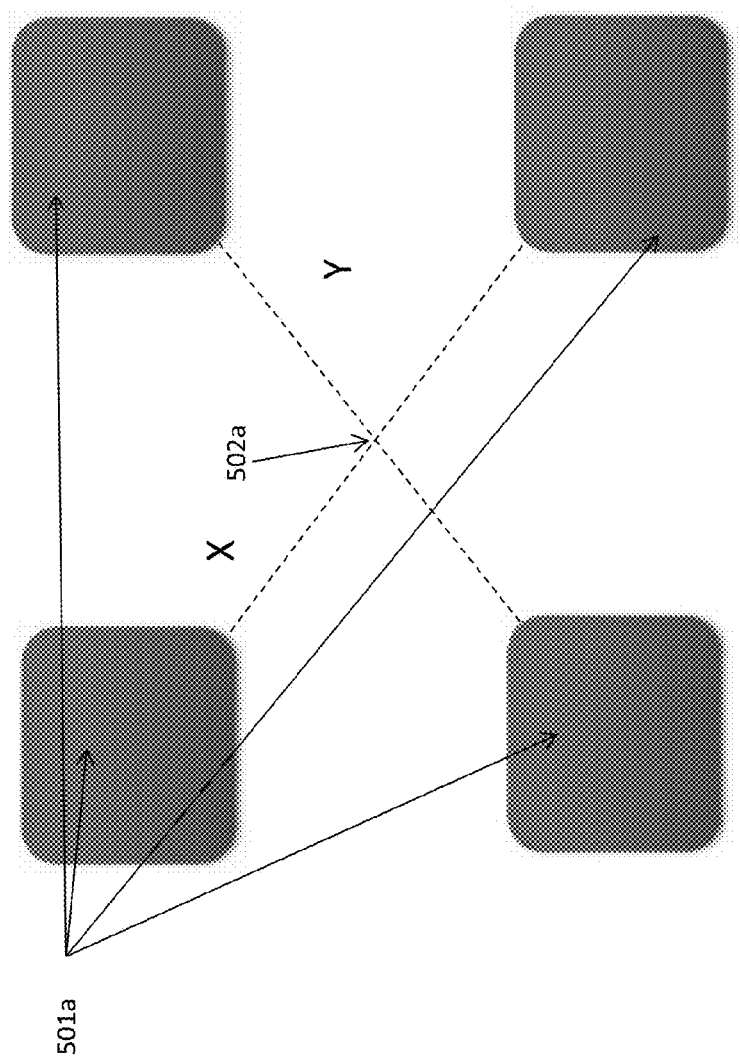

FIGS. 8A, 8B, and 8C show another embodiment of a multilevel contact in a device. In most respects, the multilevel contact is identical to that shown in FIGS. 6A-6D. However, in this embodiments, the recesses 401a-401d are not formed as trenches, but instead each recess 401a-401d is formed as canyon defined by a respective plurality of pillars 501a-501d. A canyon may be a continuous recessed space with columns (e.g., columns having circular or rectangular cross sections) protruding from the bottom of the recessed space. As shown, for each plurality of pillars 501a-501d, a respective via connection 306a-306d extends downwards towards a laterally central portion of the canyon.

As shown in detail in FIG. 8C, this laterally central portion 502a of the canyon recess 401a may be defined by intersection of a first line X extending laterally between a first pair of the four pillars 501a and second line Y extending laterally between a second pair of the four pillars 501a. In some embodiments, the four pillars 501a may be arranged, e.g., in a square or rectangular pattern, and the lines X and Y may be the diagonals between the vertices of the corresponding square or rectangle. However, in various embodiments any other suitable shape may be used. The pillars 501a, as viewed from above, may have any suitable shape, such as circular, oval, or rectangular. A similar configuration may be used for the remaining recesses 401b-401d FIG. 8B shows top views of each electrically conductive layer 302a-302d in the region of the trenches 401a-401d. Note that, as was the case for the embodiment shown in FIGS. 6A-6D, each electrically conductive layer 302a-302d contacts exactly one via connection 306a-306d, while including gaps 410 that avoid contact with the other ones of the via connections 306a-306d. For example, the electrically conductive layer 302a contacts only via connection 306a, while including gaps 410 that via connections 306b-306d may pass through. The electrically conductive layer 302b contacts only via connection 306b, while including gaps 410 that via connections 306a, 306c, 306d may pass through, and so forth. Rather that elongated rectangular gaps used in the embodiment of FIG. 6D, the smaller gaps 410 in FIG. 8B may have a square shape (e.g., having the shape of the cross section of pillars 510).

As shown in FIG. 8B, the gaps 410 in the electrically conductive layer may have a nested arrangement similar to that shown in FIG. 6D. In FIG. 6D each of the gaps 410 are elongated slits In the bottom conductive layer 302d, whereas in FIG. 8B these slits are each replaced by a grouping of four gaps 410 (corresponding to the cross sectional shape of the pillars 510). The via connection 306d contacts the layer 302d at a portion of the layer (indicated by a dot) surrounded by the leftmost grouping of four gaps 410.

In the remaining conductive layers 306a-306c, in FIG. 6D each of the gaps 410 (except the leftmost gap 410) are elongated slits, whereas in FIG. 8B these slits are each replaced by a grouping of four gaps 410 (corresponding to the cross sectional shape of the pillars 510). As in FIG. 6A, the leftmost gap 410 in FIG. 8B is relatively larger (e.g. wider) than the remaining gaps 410, and allows one or more via connections to pass through the leftmost gap 410 to reach an underlying layer 302. For each of the layers 302a-302c, the respective via connection 306a-306c contacts the layer 302a-302c at a portion of the layer surrounded by the second leftmost grouping of four gaps 410 (indicated by a dot).

The embodiment of FIGS. 8A-8B may be advantageous in that the use of canyon shaped recess 401 may allow the contact region where each electrically conductive layer 302 contacts the via connection 306 is laterally wider in one or more lateral dimensions than the corresponding region in embodiments using a trench shaped recess 401.

Although the embodiments shown in FIGS. 6A-6D and in FIGS. 8A-8C each feature a single type of recess 401, it is to be understood that in various embodiments any suitable combination of types of recesses 401 may be used.

As previously mentioned, the conductive layers 302a, 302b, 302c and 302d extend past the left side of the illustration in, e.g., FIG. 6A or FIG. 8A, to provide electrical connections to respective levels in a multilevel device in the device region. In some embodiments the multilevel device is a memory device, such as a vertical NAND device or a ReRAM device.

For example, the multilevel device may be a NAND device such as the monolithic three dimensional NAND string 180 shown in FIGS. 1A-3B. Electrically conductive layers 302a-302d in the stack 301 may each include or are electrically connected to, e.g., a word line of the NAND device.

For example, in some embodiments, the NAND device may include a plurality of semiconductor channels (e.g., semiconductor channel 1 of NAND string 180), where at least one end portion of each of the plurality of semiconductor channels extends substantially perpendicular to a major surface of the substrate 100. The NAND device may include a plurality of charge storage regions, each charge storage region located adjacent to a respective one of the plurality of semiconductor channels (e.g., discrete charge storage segments 9 of the NAND string 180). The NAND device may also include a plurality of control gate electrodes (e.g., electrodes 3/302) having a strip shape extending substantially parallel to the major surface of the substrate, where the plurality of control gate electrodes include at least a first control gate electrode located in the first device level and a second control gate electrode located in the second device level (e.g., control gate electrodes 3a and 3b of the NAND string 180 shown in FIGS. 1B and 2B). In some embodiments, a first one (e.g., conductive layer 302a) of the plurality of electrically conductive layers 302a-302d in the stack 301 is in electrical contact with the first control gate electrode 3a and extends from the device region to the contact region 300, and a second one (e.g., conductive layer 302b) of the plurality of electrically conductive layers 302a-302d in the stack 301 is in electrical contact the second control gate electrode 3b and extends from the device region to the contact region 300.

As discussed above with reference to FIG. 4, in some embodiments, a ReRAM device may include one or more vertical stacks of word line electrodes $WL_{zy}$. In some embodiments, a first one (e.g., conductive layer 302a) of the plurality of electrically conductive layers 302a-302d in the stack 301 is in electrical contact with a world line electrode (e.g., $WL_{11}$) and extends from the device region to the contact region 300, and a second one (e.g., conductive layer 302b) of the plurality of electrically conductive layers 302a-302d in the stack 301 is in electrical contact the a second word line electrode (e.g., $WL_{21}$) and extends from the device region to the contact region 300.

FIGS. 9A-9E illustrate a method of making a multilevel contact in a device shown in FIGS. 6A-6D or in FIGS. 8A and 8B.

Figure 9A:
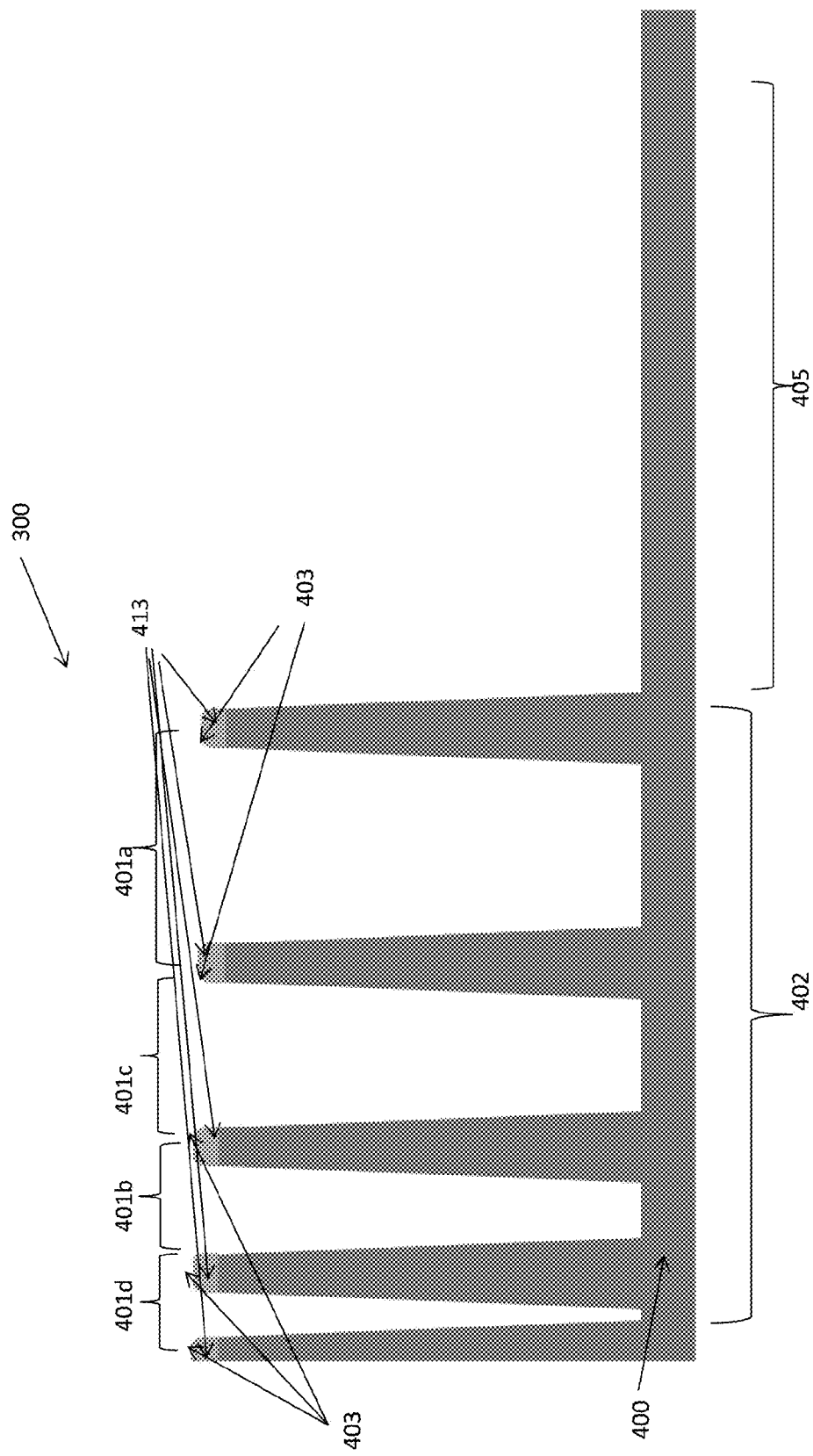

As shown in FIG. 9A, an in-process multilevel device is provided including at least one device region (not shown) and at least one contact region 300. A base 400 (e.g., a substrate or an insulating layer) is formed in the contact region that includes a raised portion 402 and plurality of recesses 401a-401d in the raised portion. Each recess in the plurality of recesses 401a-401d has a different lateral size (e.g., width in the x direction) from the other recesses in the plurality of recesses 401a-401d. Although four recesses 401a-401d are shown, as discussed above, any suitable number may be used.

As shown, the recesses 401a-401d comprise trenches. However, in other embodiments the recesses may take other forms. For example, as described in greater detail with reference to FIGS. 8A-8B, the recesses 401a-401d may be formed as a canyon defined by a plurality of pillars.

The raised portion 402 in the base 400 and the trenches 401a-40d may be formed using any suitable process. For example, a patterned mask 413 (e.g., a hard mask made of any suitable material such as amorphous C, SiN, $SiO_2$, a metal, etc.) may be formed over a substrate or an insulating layer 400 using, e.g., photolithography and etching, and exposed portions of substrate removed (e.g., etched) to form the raised portion 402 and/or recesses 401a-401d. As shown, a portion of material from the hard mask 413 may remain after etching the top surfaces 403 of the raised portion of the base 400 in which the recesses 401a-401d are formed.

Some embodiments may include providing the base 400 in the contact region 300, and forming a patterned hard mask 413 on the base layer 400 and removing portions of the base layer 400 exposed by the hard mask 413 to form an unraised portion of the base layer 400 and the plurality of recesses 401a-401d in the raised portion of the base layer 400.

In some embodiments, the hard mask 413 may include a plurality of lines (e.g., where the recesses 401a-401d are trenches) or a plurality of spots (e.g., where the recesses 401a-401d are canyons defined by a plurality of pillars) separated by gaps corresponding to the shape of the recesses 401a-401d. The spots may have any suitable shape, e.g., circular, oval, square, polygonal, etc. to match the shape of the pillars 501. In some embodiments the mask used to form the raised portion 402 and the recesses 401a-401d may be formed using a single photolithographic process. For example, in some embodiments the hard mask 413 does not cover regions which are also etched in the same step as the recesses 401.

Figure 9B:
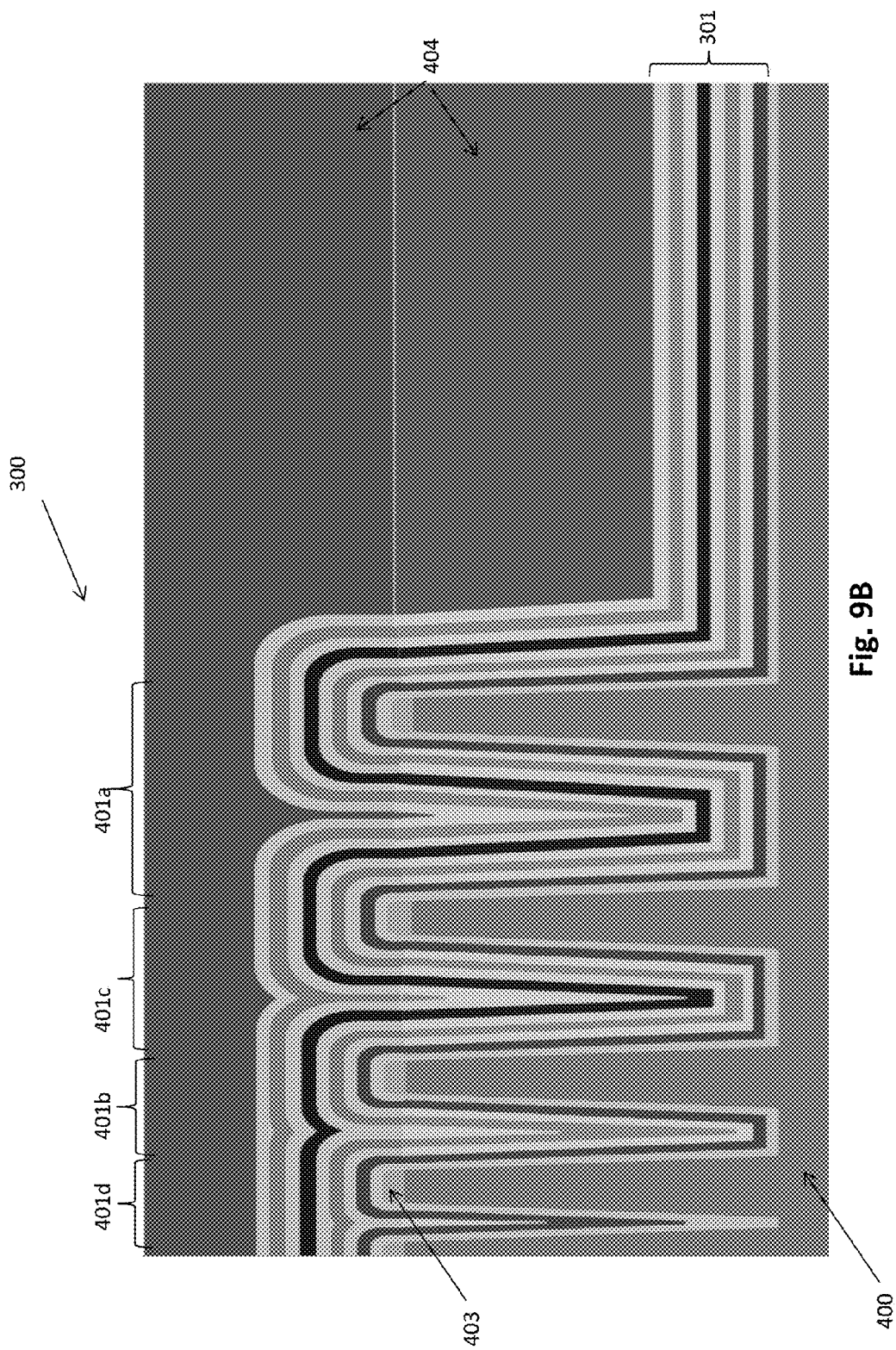

As shown in FIG. 9B a conformal stack 301 of an alternating plurality of continuous electrically conductive layers 302a-302d and plurality of electrically insulating layers 303a-303e are sequentially formed over the base 400. Each electrically conductive layer 302a-302d in the stack 301 is electrically insulated from the other electrically conductive layers 302a-302d in the stack 301. For example, electrically conductive layer 302a is insulated from layer 302b-302d, and so forth. In some embodiments, a fill layer 404 (e.g., and insulating layer) may be formed over the stack 301 and the base 400. For example, the fill layer may be formed to a vertical height above the portion of the stack 301 overlaying the raised portion 402 of the base 400.

In various embodiments the layers in the stack 301 may be formed using any suitable technique including, for example, chemical vapor deposition or atomic layer deposition.

As shown, a first recess 401a and region 405 are filled with portions of all of the electrically conductive layers 302a-302d and insulating layers 303a-303e in the stack 301. A second recess 401b that is laterally smaller (e.g., narrower) than the first recess 401a is filled with portions of all of the electrically conductive layers 302b-302d and insulating layers 303b-303e in the stack 301 except for an uppermost first electrically conductive layer 302a and insulating layer 303a in the stack. In other words, since recess 401b is narrower than recess 401a, the recess 401b is completely filled by conductive layers 302b-30d and insulating layers 303b-303e, forcing layers 302a and 303a to be formed above the recess 401b on the surface of layer 303b.

Similarly, recess 401c is laterally smaller than recess 401b, and contains only portions of conductive layers 302c and 302d and insulating layers 303c-303e. Recess 401d is smaller than recess 401c and contains only portions of conductive layer 302d and insulating layers 303d and 303e.

Figure 10:
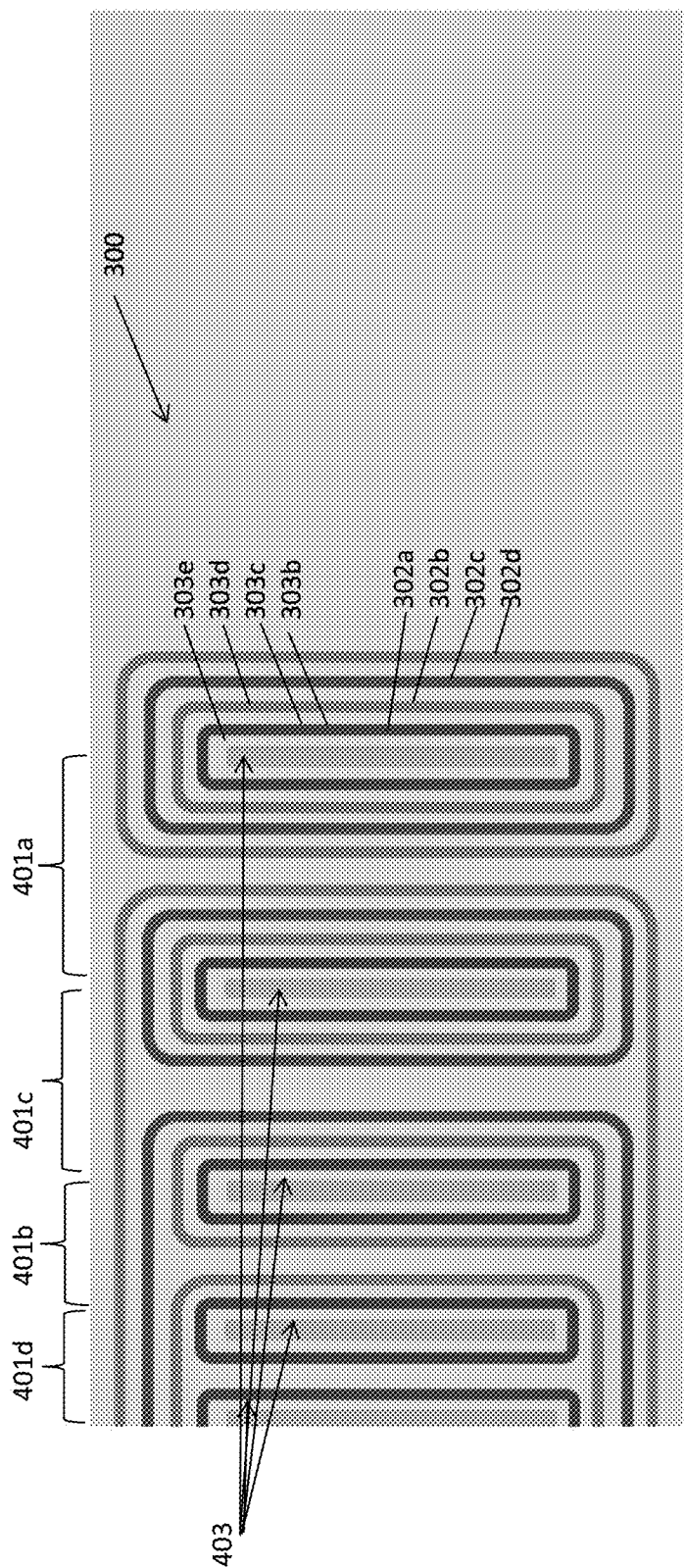
FIG. 10 is a top view of the in-process multilevel contact of FIG. 9C.

As shown in FIG. 9C and FIG. 10, material is removed (e.g., by any suitable etch back process, chemical mechanical polishing, or any other suitable technique) from the stack 301 that overlays the raised portion 402 of the base 400 to expose one or more top surfaces 403 of the raised portion 402 of the base 400. The layer 404 may also be partially or completely removed in region 405 to planarize the top surface of layer 404 with the top surfaces 403. As shown, portions of the stack 301 that are contained in the recesses 401a-401d are not removed.

As shown, a portion of the uppermost first electrically conductive layer 302a in the stack 301 is exposed in a laterally central portion of first recess 401a. A portion of a second electrically conductive layer 302b underlying the uppermost first electrically conductive layer 302a is exposed in a laterally central portion the second recess 401b. Similarly, a portion of a third electrically conductive layer 302c is exposed in a laterally central portion of a third recess 401c and a portion of a third electrically conductive layer 302d is exposed in a laterally central portion of a third recess 401d. In various embodiments, any number of layers 302 and trenches 401 may be used, such that portion of a respective conductive layer 302 is exposed in a laterally central portion of each recess 401.

In some embodiments, the stack 301 includes N layers $l_n$ where n is any integer and where 1≤n≤N, and N is a positive integer greater than 2. In some embodiments, the base 400 comprises N recesses $r_n$. Some embodiments include filling the recesses such that the recess $r_n$ contains a portion of the first n bottommost electrically conductive layers 302 in the stack 301. In some embodiments, after the etching step described above, the layer $l_n$ is the topmost electrically conductive layer 302 in a laterally central portion of a respective recess $r_n$.

Figure 9D:
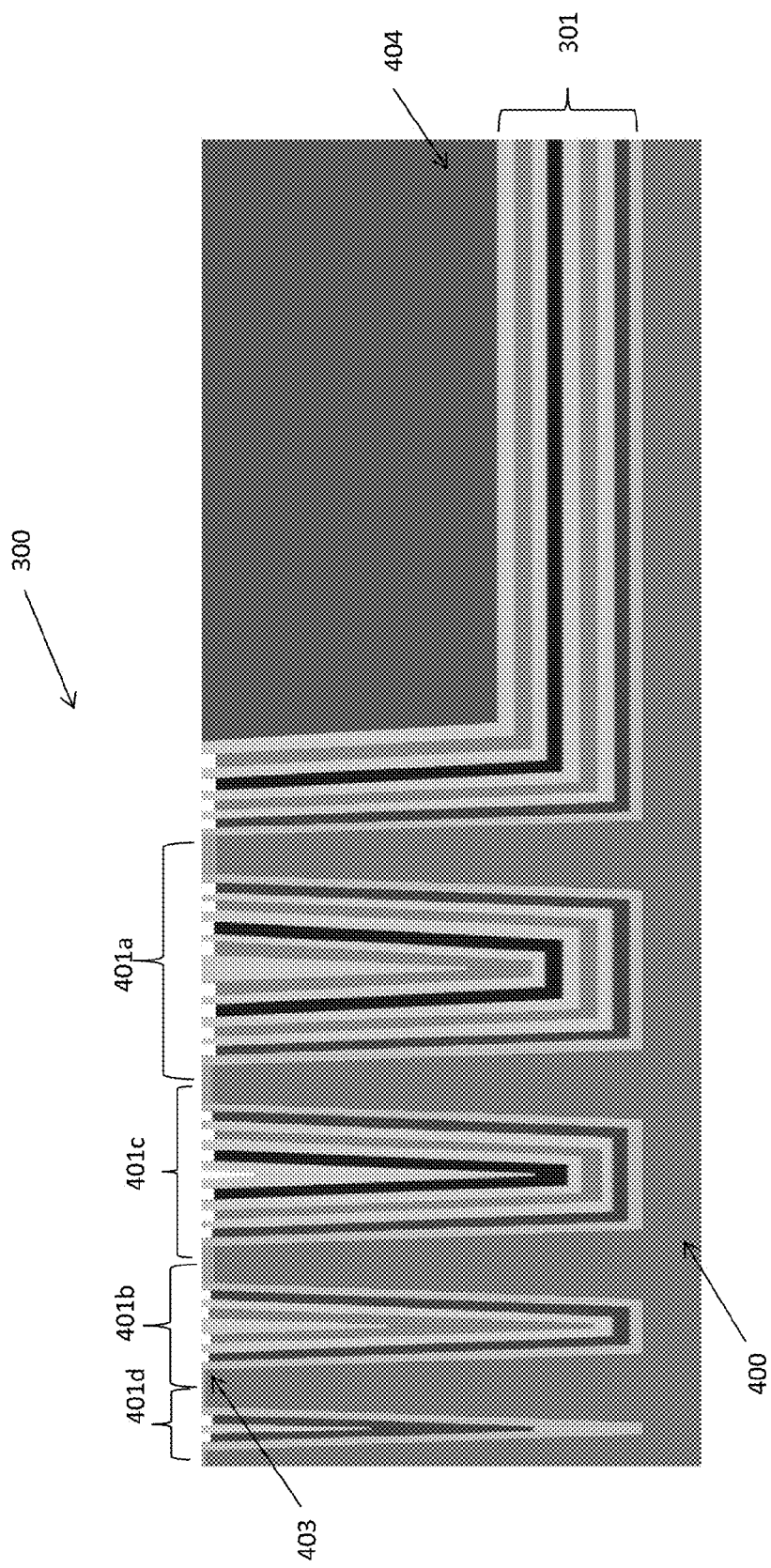

Referring to FIG. 9D, in some embodiments, exposed portion of the electrically conductive layers 302a-302d contained in the recesses 401a-402d may be etched back to a height below the top portions 403 of the recesses 401a-401d in the base 400, using, e.g., selective etching. A close up view of the recessed portions of conductive layers 302a-302d is shown in FIG. 7A.

Figure 9E:
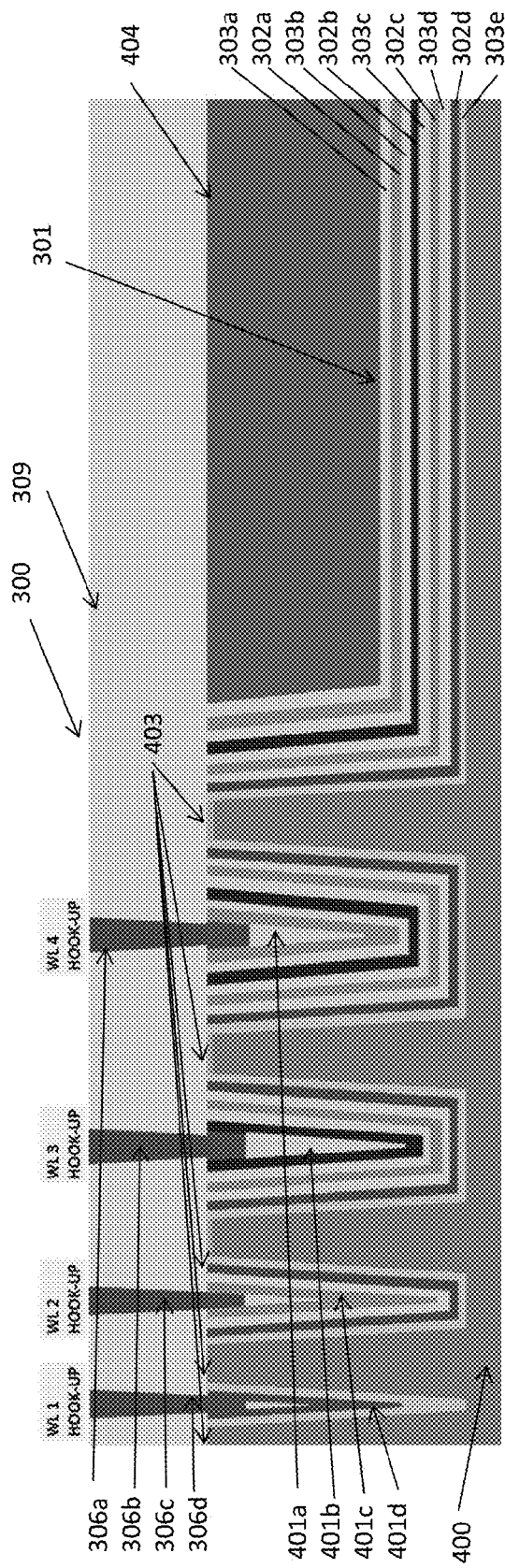

Referring to FIG. 9E, an overlayer 309 is formed overlaying the stack 301, layer 404, and base 400, such that the overlayer is in contact with the one or more top surfaces 403 of the raised portion 402 of the base 400. A first via connection 306a is formed that extends vertically through the overlayer 309 (e.g., in the via opening in the overlayer 309) and contacts the first electrically conductive layer 302a at the laterally central portion of the first recess 401a. A second via connection 306b is formed that extends vertically through the overlayer 309 and contacts the second electrically conductive layer 302a at the laterally central portion of the second recess 301b. The first via connection 306a is in electrical contact with the first electrically conductive layer 302a, and electrically insulated from all other electrically conductive layers 302b-302d in the stack 301. The second via connection 306b is in electrical contact with the second electrically conductive layer 302b, and electrically insulated from all other electrically conductive layers 302a, 302c, 302d in the stack 301.

Similarly, via connections 306c and 306d form electrical contacts with only electrical conductive layers 302c and 302d respectively.

The via connections 306 may be formed using any suitable technique, e.g., using lithographic patterning and etching to create via openings in layer 309 which are then filled with electrically conductive material. The electrically conductive material may then be planarized with the top of layer 309 by, e.g., etch back or chemical mechanical polishing. The resulting structure is equivalent to that shown in FIGS. 6A-6D or FIGS. 8A and 8B.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A multilevel device, comprising:
    at least one device region and at least one contact region having a stack of alternating plurality of continuous electrically conductive layers and plurality of electrically insulating layers located over a base, wherein:
        each electrically conductive layer in the stack is electrically insulated from the other electrically conductive layers in the stack;
        the base comprises a raised portion and a plurality of recesses in the raised portion, each recess in the plurality of recesses having a different lateral size from the other recesses in the plurality of recesses;
        the electrically conductive layers in the stack are substantially conformal to the plurality of recesses in the base and expose one or more top surfaces of the raised portion of the base;
        a first electrically conductive layer in the stack is a topmost layer in a laterally central portion of a first one of the plurality of recesses; and
        a second electrically conductive layer in the stack different from the first electrically conductive layer is a topmost layer in a laterally central portion of a second one of the plurality of recesses.

2. The device of claim 1, wherein the base further comprises a substantially flat unraised portion.

3. The device of claim 1, wherein at least one of the plurality of recesses comprises a trench.

4. The device of claim 1, wherein the raised portion comprises a plurality of pillars, and at least one of the plurality of recesses comprises a canyon defined by the plurality of pillars.

5. The device of claim 3, wherein the plurality of pillars comprises at least four pillars, and wherein the respective laterally central portion of the recess is a point defined by an intersection of a first line extending laterally between a first pair of the at least four pillars and second line extending laterally between a second pair of the at least four pillars.

6. The device of claim 1, wherein the first recess contains a portion of each one of the electrically conductive layers in the stack.

7. The device of claim 6, wherein the second recess contains a portion of fewer than all of the electrically conductive layers in the stack.

8. The device of claim 7, further comprising:
    an overlayer overlaying the stack and the base, wherein the overlayer is in contact with one or more top surfaces of the raised portion of the base;

a first via connection that extends vertically through the overlayer and contacts the first electrically conductive layer at the laterally central portion of the first recess; and a second via connection that extends vertically through the overlayer and contacts the second electrically conductive layer at the laterally central portion of the second recess;

wherein the first via connection is in electrical contact with the first electrically conductive layer, and electrically insulated from all other electrically conductive layers in the stack; and wherein the second via connection is in electrical contact with the second electrically conductive layer, and is electrically insulated from all other electrically conductive layers in the stack.

9. The device of claim 8, wherein:

the first electrically conductive layer extends laterally past the first via connection at the location of contact between the first electrically conductive layer and the first via connection; and the second electrically conductive layer extends laterally past the second via connection at the location of contact between the second electrically conductive layer and the second via connection.

10. The device of claim 9, wherein:

tops of the plurality of electrically conductive and insulting layers in the stack are removed in each of the plurality of recesses to expose sidewalls of a respective one of the electrically conductive layers; and a respective one of the first and second via connections contacts sidewalls of the respective first and second of the plurality of electrically conductive layers in respective first and second recesses.

11. The device of claim 7, wherein:

the stack comprises N layers $l_n$ where n is any integer where $1 \leq n \leq N$, and N is a positive integer greater than 2;

the base comprises N recesses $r_n$;

a recess $r_n$ contains a portion of the first n bottommost electrically conductive layers in the stack;

a layer $l_n$ is the topmost electrically conductive layer in a laterally central portion recess $r_n$.

12. The device of claim 9, further comprising N via connections $v_n$;

wherein the overlayer is in contact with one or more top surfaces of the raised portion of the base; and wherein a via connection $v_n$ extends vertically through the overlayer to contact the electrically conductive layer $l_n$ in the laterally central portion of the recess $r_n$.

13. The device of claim 12, wherein N is greater than 3.

14. The device of claim 1, wherein:

the device region comprises a 3D ReRAM device; and at least one of the electrically conductive layers in the stack comprises or is electrically connected to a word line of the 3D ReRAM device.

15. The device of claim 1, wherein:

the device region comprises a vertical NAND memory device; and at least one of the electrically conductive layers in the stack comprises or is electrically connected to a word line of vertical NAND memory device.

16. A method of making multilevel contacts, comprising:

(a) providing an in-process multilevel device comprising at least one device region and at least one contact region;

(b) forming a base in the contact region comprising a raised portion and plurality of recesses in the raised portion, each recess in the plurality of recesses having a different lateral size from the other recesses in the plurality of recesses;

(c) forming a conformal stack of an alternating plurality of continuous electrically conductive layers and plurality of electrically insulating layers located over a base, wherein each electrically conductive layer in the stack is electrically insulated from the other electrically conductive layers in the stack; and (d) removing material from the stack that overlays the raised portion of the base to expose one or more top surfaces of the raised portion of the base, wherein portions of the stack contained in the recesses are not removed.

17. The method of claim 16, wherein step (c) comprises:

filling a first recess with portions of all of the plurality of electrically conductive layers in the stack; and filling a second recess that is laterally smaller that the first recess with portions of all of the electrically conductive layers in the stack except for an uppermost first electrically conductive layer in the stack.

18. The method of claim 17, wherein step (c) further comprises:

filling a third recess that is laterally smaller than the second recess with portions of all of the plurality of electrically conductive layers in the stack except for the two uppermost electrically conductive layers in the stack.

19. The method of claim 17, wherein step (d) comprises:

exposing a portion of the uppermost first electrically conductive layer in the stack in a laterally central portion of first recess; and exposing a portion of a second electrically conductive layer in the stack underlying the uppermost first electrically conductive layer in the stack in a laterally central portion the second recess.

20. The method of claim 18, wherein step (d) comprises:

exposing a portion of the uppermost first electrically conductive layer in the stack in a laterally central portion of the first recess;

exposing a portion of a second electrically conductive layer underlying the uppermost first electrically conductive layer in the stack at a laterally central portion of the second recess; and exposing a portion of a third electrically conductive layer underlying the second electrically conductive layer in the stack at a laterally central portion of the third recess.

21. The method of claim 19, further comprising:

forming an overlayer overlaying the stack and base, such that the overlayer is in contact with the one or more top surfaces of the raised portion of the base;

forming a first via connection that extends vertically through the overlayer and contacts the first electrically conductive layer at the laterally central portion of the first recess; and forming a second via connection that extends vertically through the overlayer contacts the second electrically conductive layer at the laterally central portion of the second recess;

wherein the first via connection is in electrical contact with the first electrically conductive layer in the stack, and electrically insulated from all other electrically conductive layers in the stack; and wherein the second via connection is in electrical contact with the second electrically conductive layer in the stack, and electrically insulated from all other electrically conductive layers in the stack.

22. The method of claim 21, wherein:
the first electrically conductive layer extends laterally past the first via connection at a location of contact between the first electrically conductive layer and the first via connection; and
the second electrically conductive layer extends laterally past the second via connection at a location of contact between the second electrically conductive layer and the second via connection.

23. The method of claim 16, wherein:
the stack comprises N layers $l_n$ where n is any integer where $1 \leq n \leq N$, and N is a positive integer greater than 2;
the base comprises N recesses $r_n$;
step (c) comprises filling the recesses such that the recess $r_n$ contains a portion of the first n bottommost electrically conductive layers in the stack; and
following step (d) the layer $l_n$ is the topmost electrically conductive layer in a laterally central portion recess $r_n$.

24. The method of claim 23, comprising:
forming an overlayer overlaying the stack and base, wherein the overlayer is in contact with the one or more top surfaces of the raised portion of the base; and
forming N via connections $v_n$, wherein a via connection $v_n$ extends vertically through the overlayer to contact an electrically conductive layer $l_n$ at the laterally central portion of a recess $r_n$.

25. The method of claim 24, wherein N is greater than 3.

26. The method of claim 16, wherein at least one of the plurality recesses comprises a trench.

27. The method of claim 16, wherein the raised portion of the base comprises a plurality of pillars, and at least one of the recesses comprises a canyon defined by a plurality of pillars.

28. The method of claim 27, wherein the plurality of pillars comprises at least four pillars, and wherein the respective laterally central portion of the recess is a point defined by intersection of a first line extending laterally between a first pair of the at least four pillars and second line extending laterally between a second pair of the at least four pillars.

29. The method of claim 16, further comprising forming the base by:
providing a base layer in the contact region;
forming a hard mask pattern on the base layer; and
removing portions of the base layer exposed by the hard mask pattern to form an unraised portion of the base layer and the plurality of recesses in the raised portion of the base layer.

30. The method of claim 29, wherein the hard mask pattern comprises a plurality of lines.

31. The method of claim 29, wherein the hard mask pattern comprises a plurality of spots.

32. The method claim 29, wherein the step of forming the hard mask pattern requires only one photolithographic process.

33. The method of claim 29, wherein the base layer comprises a substrate or an insulating layer.

34. The method of claim 16, wherein at least one of the electrically conductive layers in the stack comprises or is electrically connected to a word line of a 3D ReRAM device.

35. The method of claim 16, wherein at least one of the electrically conductive layers in the stack comprises or is electrically connected to a word line of a vertical NAND memory device.

36. The method of claim 17, wherein all of the electrically conductive layers in the stack except the topmost electrically conductive layer fill the lateral width of the second recess such that the topmost electrically conductive layer in the stack does not extend into the second recess.

37. The method of claim 36, wherein step (d) comprises removing the topmost electrically conductive layer over the second recess and over the one or more top surfaces of the raised portion of the base.

38. A monolithic, three dimensional array of memory devices located over a silicon substrate, comprising:
an array of vertically oriented NAND strings in which at least one memory cell in a first device level of the array is located over another memory cell in a second device level;
an integrated circuit comprising a driver circuit for the array of memory devices located on the silicon substrate; and
at least one device region and at least one contact region having a stack of alternating plurality of continuous electrically conductive layers and plurality of electrically insulating layers located over a base, wherein:
each electrically conductive layer in the stack is electrically insulated from the other electrically conductive layers in the stack;
the base comprises a raised portion and a plurality of recesses in the raised portion, each recess in the plurality of recesses having a different lateral size from the other recesses in the plurality of recesses;
the electrically conductive layers in the stack are substantially conformal to the plurality of recesses in the base and expose one or more top surfaces of the raised portion of the base;
a first electrically conductive layer in the stack is a topmost layer in a laterally central portion of a first one of the plurality of recesses; and
a second electrically conductive layer in the stack different from the first electrically conductive layer is a topmost layer in a laterally central portion of a second one of the plurality of recesses.

39. The device of claim 38, wherein at least one of the electrically conductive layers in the stack comprises or is electrically connected to a word line of the array of vertically oriented NAND strings.

* * * * *